(12) United States Patent
Nakashima et al.

(10) Patent No.: US 8,469,285 B2
(45) Date of Patent: Jun. 25, 2013

(54) CHEMICAL LIQUID SUPPLY NOZZLE AND CHEMICAL LIQUID SUPPLY METHOD

(75) Inventors: Tsunenaga Nakashima, Kumamoto (JP); Shinichi Hayashi, Kumamoto (JP); Akihiro Fujimoto, Kumamoto (JP); Takahiro Ookubo, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 226 days.

(21) Appl. No.: 12/973,043

(22) Filed: Dec. 20, 2010

(65) Prior Publication Data
US 2011/0159701 A1 Jun. 30, 2011

(30) Foreign Application Priority Data
Dec. 25, 2009 (JP) ................................. 2009-295377

(51) Int. Cl.
*B05B 17/00* (2006.01)

(52) U.S. Cl.
USPC ................. 239/1; 239/106; 239/119; 251/16; 118/302

(58) Field of Classification Search
USPC . 239/1, 106, 119; 251/16; 417/111; 438/758; 118/302
See application file for complete search history.

(56) References Cited

U.S. PATENT DOCUMENTS

| | | | | |
|---|---|---|---|---|
| 6,082,629 A | * | 7/2000 | Lee et al. | 239/106 |
| 6,176,438 B1 | * | 1/2001 | Sato et al. | 239/119 |
| 6,332,924 B1 | * | 12/2001 | Shim et al. | 118/684 |
| 2005/0238504 A1 | * | 10/2005 | Yajima | 417/394 |
| 2005/0284955 A1 | * | 12/2005 | Fukano et al. | 239/119 |
| 2007/0151512 A1 | * | 7/2007 | Son et al. | 118/300 |
| 2007/0245953 A1 | * | 10/2007 | Nakashima et al. | 118/313 |

FOREIGN PATENT DOCUMENTS

| | | |
|---|---|---|
| JP | 62-58399 U | 4/1987 |
| JP | 10-57850 A | 3/1998 |
| JP | 2005-270694 A | 10/2005 |
| JP | 2006-302934 A | 11/2006 |

OTHER PUBLICATIONS

An Office Action dated Jan. 10, 2012, issued from the Japanese Patent Office (JPO) of Japanese Patent Application No. 2009-295377 and a partial English translation thereof.

* cited by examiner

*Primary Examiner* — Dinh Q Nguyen
*Assistant Examiner* — Joel Zhou
(74) *Attorney, Agent, or Firm* — Abelman, Frayne & Schwab

(57) ABSTRACT

The present disclosure provides a chemical liquid supply nozzle capable of suppressing the drying process of chemical liquid with a low cost. The chemical liquid supply nozzle is provided with a cutoff valve and a suction unit that sucks chemical liquid to a suction flow path at a nozzle main body connected to a front end of flow path member. Accordingly, the chemical liquid remaining at the downstream side of the cutoff valve after the chemical liquid is discharged, is sucked toward the upstream side of the cutoff valve and removed, to thereby suppress the drying and solidifying process of the chemical liquid at the chemical liquid flow path. Also, there is no need to block the chemical liquid flow path by sucking thinner at the downstream side of chemical liquid flow path, and the number of dummy dispense may be reduced, thereby reducing an overall operation cost of the process.

15 Claims, 19 Drawing Sheets

72 : suck back valve
79 : chemical liquid suction space
91 : resist supply nozzle
102 : cutoff valve
103 : diaphragm
104 : cutoff valve main body
105 : air flow-through space
106 : chemical liquid flow-through space

FIG. 17
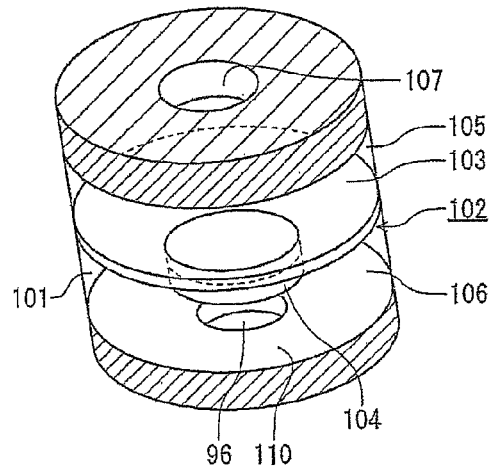
FIG. 18
(a)
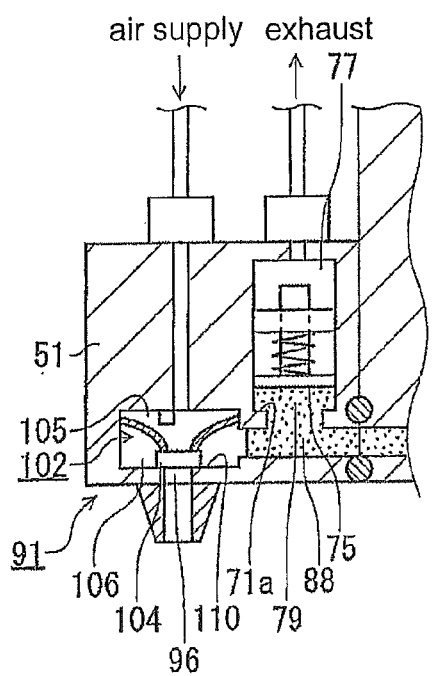
(b)
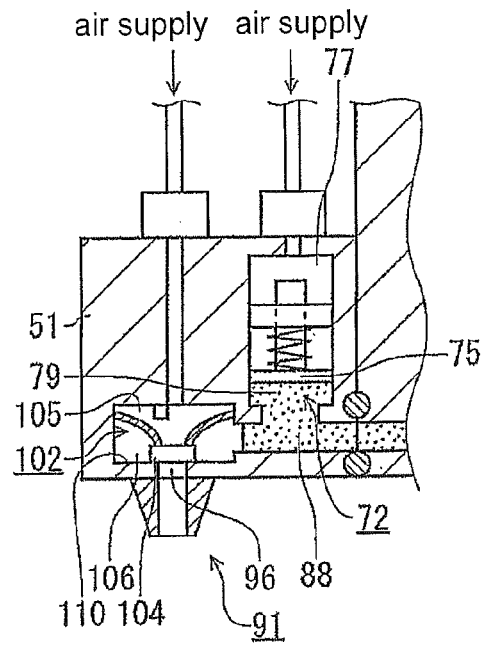

FIG. 20
(a)
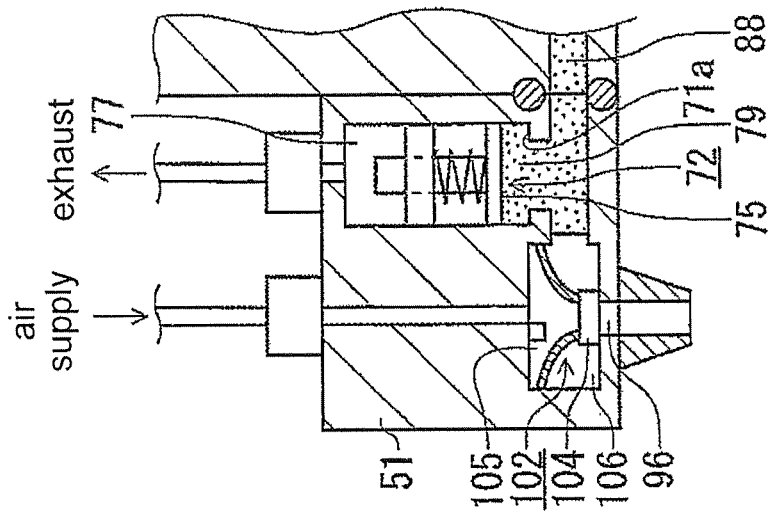
(b)
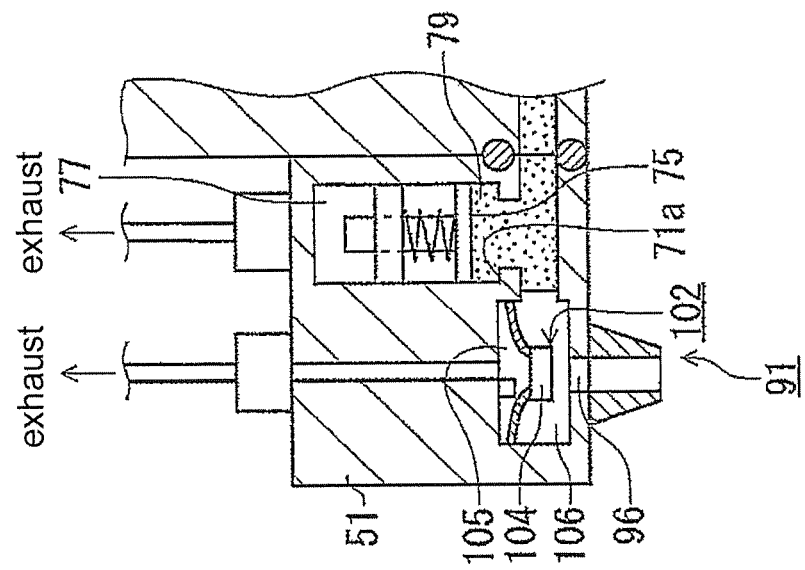

CHEMICAL LIQUID SUPPLY NOZZLE AND CHEMICAL LIQUID SUPPLY METHOD

This application is based on and claims priority from Japanese Patent Application No. 2009-295377 filed on Dec. 25, 2009, with the Japanese Patent Office, the disclosure of which is incorporated herein in its entirety by reference.

TECHNICAL FIELD

The present disclosure relates to a chemical liquid supply nozzle that supplies chemical liquid from a chemical liquid flow path, and a chemical liquid supply method.

BACKGROUND

In a photoresist process of a semiconductor fabrication process, a liquid process is performed by supplying chemical liquid to the surface of a semiconductor wafer (hereinafter "wafer"). As a module for processing the liquid process, for example, a resist application module such as a resist application apparatus for supplying a resist to the wafer has been used, and a resist supply nozzle is provided therein to supply resist to the wafer. The resist supply nozzle is usually attached to a support body, and may be spaced from the support body or from a chemical liquid supply tube for a replacement when the resist supply nozzle is broken or overly contaminated.

However, after the resist is discharged from the resist supply nozzle, the residue of resist attached to the front-end of the nozzle and the inside wall of the inner flow path thereof may be dried and solidified. This may block a normal discharge of the resist in a subsequent wafer process. In an effort to prevent this problem, a suck back valve may be provided at the upstream side of the tube of the resist supply nozzle. The suck back valve is configured to suck the liquid of the flow path at the downstream side thereof toward the upstream side of the flow path.

The operation of resist supply nozzle 201 will be described when the suck back valve is provided at the tube. After the resist is discharged from resist supply nozzle 201 to the wafer, flow path 200 is sucked up by the suck back valve, thereby attracting remaining resist 202 at the front end and near the front end of flow path 200 toward the upstream side of flow path 200. Also, an air is introduced from the outside of resist supply nozzle 201 to the inside of the flow path to form an air layer 202 at the front end of flow path 200. Subsequently, from a thinner reservoir provided in the resist application module, the suck back valve sucks thinner 204 to the front end of flow path 200.

FIG. 23 illustrates the front end of resist supply nozzle 201 where thinner 204 is sucked up. It is noted that the drying process of resist 202 is suppressed by the blocking effect of flow path 200 by thinner 204. Air layer 203 takes a role to prevent resist 202 from being diluted due to mixing of thinner 204 and resist 202. When the resist application process is performed for the wafer from the state of FIG. 23, thinner 204 is first discharged outside the wafer to be drained out, and then the process is performed.

In this case, since thinner 204 sucked to the front end of resist supply nozzle 201 may be volatilized thereby causing resist 202 to be dried out, a so-called dummy dispense such as a resist discharge process that is not intended to process the wafer is jointly utilized. Also, the front end of resist supply nozzle 201 may be cleaned with the thinner to prevent the resist at the front end of resist supply nozzle 201 from being dried and solidified.

However, the amount of thinner and resist used in the process is increased by the blocking of the flow path of resist supply nozzle 201 with the thinner, dummy dispense and cleaning of resist supply nozzle 201 using the thinner. As a result, there is problem that the processing cost is increased. Also, there is concern that thinner 204 and resist 202 inside flow path 200 may drop onto the wafer by the shock applied to resist supply nozzle 201 while the resist supply nozzle is in motion, thereby causing a defect to the product.

Japanese Utility model Laid-Open No. Sho 62-58399 discloses a liquid transfer apparatus provided with a cutoff valve at the tube to block the supply of the liquid to the downstream side. However, since the distance from the cutoff valve to the nozzle at the downstream side of the tube becomes longer in the liquid transfer apparatus, the amount of the dried resist is increased, thereby increasing the amount of the liquid for the dummy dispense. Also, when a suck back operation is performed to prevent the drying of the liquid in the tube path of the liquid transfer apparatus as mentioned above, the sucking amount is increased because the liquid at the upper stream side than the cutoff valve needs to be sucked, thereby decreasing processing efficiency.

Also, Japanese Patent Laid-Open No. Hei 10-57850 discloses a resist supply apparatus equipped with a cutoff valve and a suck back valve at the upstream side tube of the nozzle. However, the resist supply apparatus in Japanese Patent Laid-Open No. Hei 10-57850 has similar problem to the liquid transfer apparatus of Japanese Utility model Laid-Open No. Sho 62-58399. Also, Japanese Utility model Laid-Open No. 53-92390 discloses a liquid supply apparatus equipped with a suck back valve and a cutoff valve at the upstream side tube of the nozzle. However, since these valves are provided at the tube, the same problem occurs as in the liquid transfer apparatus of Japanese Utility model Laid-Open No. Sho 62-58399. Furthermore, since the suck back valve is provided at the downstream side of the cutoff valve, it is impossible to prevent the drying of the chemical liquid sucked by the open/close operation of the cutoff valve.

SUMMARY

According an aspect of the present disclosure, there is provided a chemical liquid supply nozzle including a nozzle main body connected to a front end of a flow path member through which the chemical liquid flows, a chemical liquid flow path provided at the nozzle main body to pass the chemical liquid supplied from the flow path member therethrough, a cutoff valve provided at the chemical liquid flow path to open and close the chemical liquid flow path, a suction flow path connected to the chemical liquid flow path at an upstream side of the cutoff valve, and a suction unit provided at the nozzle main body and configured to suck the chemical liquid remaining at a downstream side of the cutoff valve to an upstream side of the cutoff valve and remove by sucking the chemical liquid of the chemical liquid flow path to the suction flow path, after the chemical liquid is discharged from a downstream end of the chemical liquid flow path.

The foregoing summary is illustrative only and is not intended to be in any way limiting. In addition to illustrative aspects, embodiments and features described above, further aspects, embodiments and features will become apparent by reference to the drawings and the following detailed description.

BRIEF DESCRIPTION OF THE DRAWINGS

FIG. 17 is a perspective view of a cutoff valve.

FIG. 18 is a process diagram illustrating the operation of the resist supply nozzle.

FIG. 20a and FIG. 20b each is a process diagram illustrating the operation of the resist supply nozzle.

DETAILED DESCRIPTION

Figure 1:
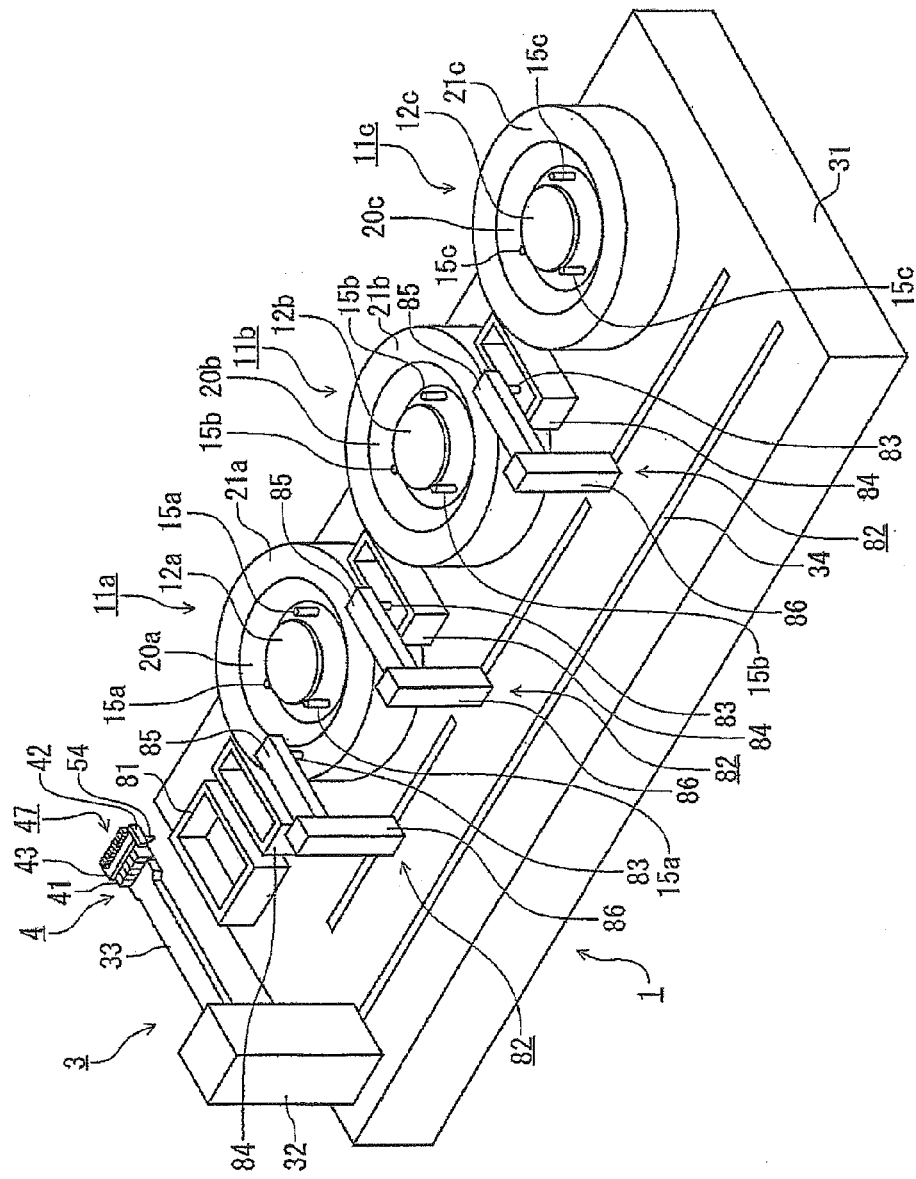
FIG. 1 is a perspective view illustrating a resist application apparatus according to the present disclosure.

In the following detail description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure addresses the above mentioned problems and provides a chemical liquid supply nozzle and method of supplying the chemical liquid, which can suppress the drying of the chemical liquid with a relatively low cost.

According to an aspect of the present disclosure, the chemical liquid supply nozzle includes a nozzle main body connected to a front end of a flow path member through which the chemical liquid flows, a chemical liquid flow path provided at the nozzle main body to pass the chemical liquid supplied from the flow path member therethrough, a cutoff valve provided at the chemical liquid flow path to open and close the chemical liquid flow path, a suction flow path connected to the chemical liquid flow path at an upstream side of the cutoff valve, and a suction unit provided at the nozzle main body and configured to suck the chemical liquid remaining at a downstream side of the cutoff valve to an upstream side of the cutoff valve and remove by sucking the chemical liquid of the chemical liquid flow path to the suction flow path, after the chemical liquid is discharged from a downstream end of the chemical liquid flow path.

For example, in the chemical liquid flow path, a first fluid flow-through space is formed at a downstream side of the suction flow path, the first fluid flow-through space is connected to the chemical liquid flow path. Moreover, the chemical liquid supply nozzle further includes a chemical liquid flow path cutoff unit including a first valve main body that divides the first fluid flow-through space and the chemical liquid flow path and is capable of entering into the chemical liquid flow path and retreating from the chemical liquid flow path, a first fluid supply flow path that supplies fluid to the first fluid flow-through space to increase pressure of the first fluid flow-through space, in order to shut off the chemical liquid flow path by pressing the first valve main body toward a wall surface directed to the first fluid flow-through space, and a first fluid removing flow path that removes the liquid from the first fluid flow-through space to decrease pressure of the first fluid flow-through space, in order to open the chemical liquid flow path by spacing the first valve main body from the wall surface. In this case, a pressure means is further provided that presses the first valve main body toward the wall surface, and the pressure means may be formed with a spring. Moreover, the first fluid removing flow path and the first fluid supply flow path may become common to form a first common fluid flow path, and the first valve main body includes a flexible membrane.

In particular, the suction unit further includes a second valve main body that divides the suction flow path into a chemical liquid reservoir directed to the chemical liquid flow path and a second fluid flow-through space spaced from the chemical liquid flow path, and the second valve main body being capable of advancing and retreating from the suction flow path with respect to the chemical liquid flow path, a second fluid supply flow path that by supplies liquid to the second fluid flow-through space to increase pressure of the second fluid flow-through space, in order to direct the second valve main body toward the chemical liquid flow path and a second fluid removing flow path that removes liquid from the second fluid flow-through space to decrease pressure of the second fluid flow-through space, in order to suck the liquid of the chemical liquid flow path to the suction flow path by moving the second valve main body to space the second valve main body from the chemical liquid flow path. In this instance, the chemical liquid supply nozzle further includes a pressure means that presses the second valve main body toward the chemical liquid flow path, and the pressure means may be constituted by a spring. Also, the second fluid removing flow path and the second fluid supply flow path become common to form a second common fluid flow path.

Specifically, the chemical liquid supply nozzle includes a plurality of nozzles as a bundle, the upstream side of the first common fluid flow path and the second common fluid flow path of each chemical liquid supply nozzle are connected to a main flow path common to each nozzle, and a control unit is provided to control liquid supply to and liquid removing from the main flow path to each of the first common fluid flow path and the second common fluid flow path.

The suction unit of the chemical liquid supply nozzle may further includes a second valve main body that defines the suction flow path into a chemical liquid reservoir directed to the chemical liquid flow path and a second fluid flow-through space spaced from the chemical liquid flow path, and the second valve main body being capable of advancing and retreating the suction flow path with respect to the chemical liquid flow path, a second fluid supply flow path that supplies liquid to the second fluid flow-through space to increase pressure of the second fluid flow-through space, in order to direct the second valve main body toward the chemical liquid flow path, and a second fluid removing flow path that removes liquid from the second fluid flow-through space to decrease pressure of the second fluid flow-through space, in order to suck the liquid of the chemical liquid flow path to the suction flow path by moving the second valve main body to space the second valve main body from the chemical liquid flow path. Again, a pressure means may be further provided that presses the second valve main body toward the chemical liquid flow path, and a spring may be used to form the pressure means. Also, the second fluid removing flow path and the second fluid supply flow path may become common to form a second common fluid flow path. Furthermore, the chemical liquid supply nozzle includes a plurality of nozzles as a bundle, the upstream side of the first common fluid flow path and the second common fluid flow path of each chemical liquid supply nozzle are connected to a main flow path common to each nozzle, and a control unit is provided to control liquid supply to and liquid removing from the main flow path to each of the first common fluid flow path and the second common fluid flow path.

According to another aspect of the present disclosure, the method of supplying chemical liquid includes steps of supplying the chemical liquid from a flow path member through which the chemical liquid flows to a nozzle main body that is connected to a front end of the flow path member, flowing the chemical liquid through a chemical liquid flow path provided in the nozzle main body, opening and closing the chemical liquid flow path by a cutoff valve provided in the chemical liquid flow path, sucking the chemical liquid in the chemical liquid flow path to a suction liquid flow path connected to the chemical liquid flow path at an upstream side of the cutoff valve by a suction unit provided in the nozzle main body, sucking and removing the chemical liquid remaining at a downstream side of the cutoff valve to an upstream side of the cutoff valve after the chemical liquid is discharged from a downstream end of the chemical liquid flow path, thereby removing the remaining chemical liquid. In particular, the suction unit may divide the suction liquid flow path into a chemical liquid reservoir space directed to the chemical liquid flow path and a second fluid flow-through space spaced from the chemical liquid, and includes a second valve main body that is capable of introducing and retreating the suction flow path with respect to the chemical liquid. Moreover, the method may further include steps of increasing pressure of a second fluid flow-through space by supplying liquid to the second fluid flow-through space via a second fluid supply flow path, moving the second valve main body toward the chemical liquid flow path, decreasing pressure of the second fluid flow-through space by removing liquid from the second fluid flow-through space via a second fluid removing flow path, and sucking chemical liquid of the chemical liquid flow path to a suction flow path by spacing the second valve main body from chemical liquid flow path.

In particular, a first fluid flow-through space may be formed at a downstream side of the suction flow path to be connected with the chemical liquid flow path, and the method may further includes steps of introducing a first valve main body, that forms a cutoff unit of the chemical liquid flow path and provided to divide the first fluid flow-through space and the chemical liquid flow path, into the chemical liquid flow path, retreating the first valve main body from the chemical liquid flow path, increasing pressure of the first fluid flow-through space by supplying liquid to a first fluid supply flow path, blocking the chemical liquid flow path by pressing the first valve main body toward a wall directed to the first fluid flow-through space, decreasing pressure of the first fluid flow-through space by removing the liquid from the first fluid flow-through space via a first fluid removing flow path, and opening the chemical liquid flow path by separating the first valve main body from the wall.

In particular, the suction unit may include a second valve main body that divides the suction flow path into a chemical liquid reservoir space directed to the chemical liquid flow path and a second fluid flow-through space spaced from the chemical liquid, and the second valve main body being capable of introducing and retreating the suction flow path with respect to the chemical liquid. Moreover, the method may further include steps of increasing pressure of a second fluid flow-through space by supplying liquid to the second fluid flow-through space via a second liquid supply path, moving the second valve main body toward the chemical liquid flow path, decreasing pressure of the second fluid flow-through space by removing liquid from the second fluid flow-through space via a second fluid removing flow path, and sucking chemical liquid of the chemical liquid flow path to a suction flow path by separating the second valve main body from chemical liquid flow path.

The chemical liquid supply nozzle of the present disclosure is provided with a cutoff valve and a suction unit that sucks chemical liquid to a suction flow path at a nozzle main body connected to a flow path member. With these features, the chemical liquid remaining at the downstream side of the cutoff valve after the chemical liquid is discharged is introduced into the upstream side of the cutoff valve to thereby be removed, and the chemical liquid flow path provided in the nozzle main body may be shut off by the cutoff valve. Due to this, the drying and solidifying process of the chemical liquid may be suppressed at the chemical liquid flow path. Also, there is no need to block the chemical liquid flow path by sucking, for example, thinner at the downstream side of the chemical liquid flow path, and the number of dummy dispense may also be suppressed, thereby reducing the overall operation cost of the process. Also, the drop of the chemical liquid from the chemical liquid flow path may also be avoided. Moreover, since the cutoff valve and the suction unit are provided in the nozzle main body, not in the tube, the suction amount is relatively small, thereby increasing the processing efficiency.

First Embodiment

Figure 2:
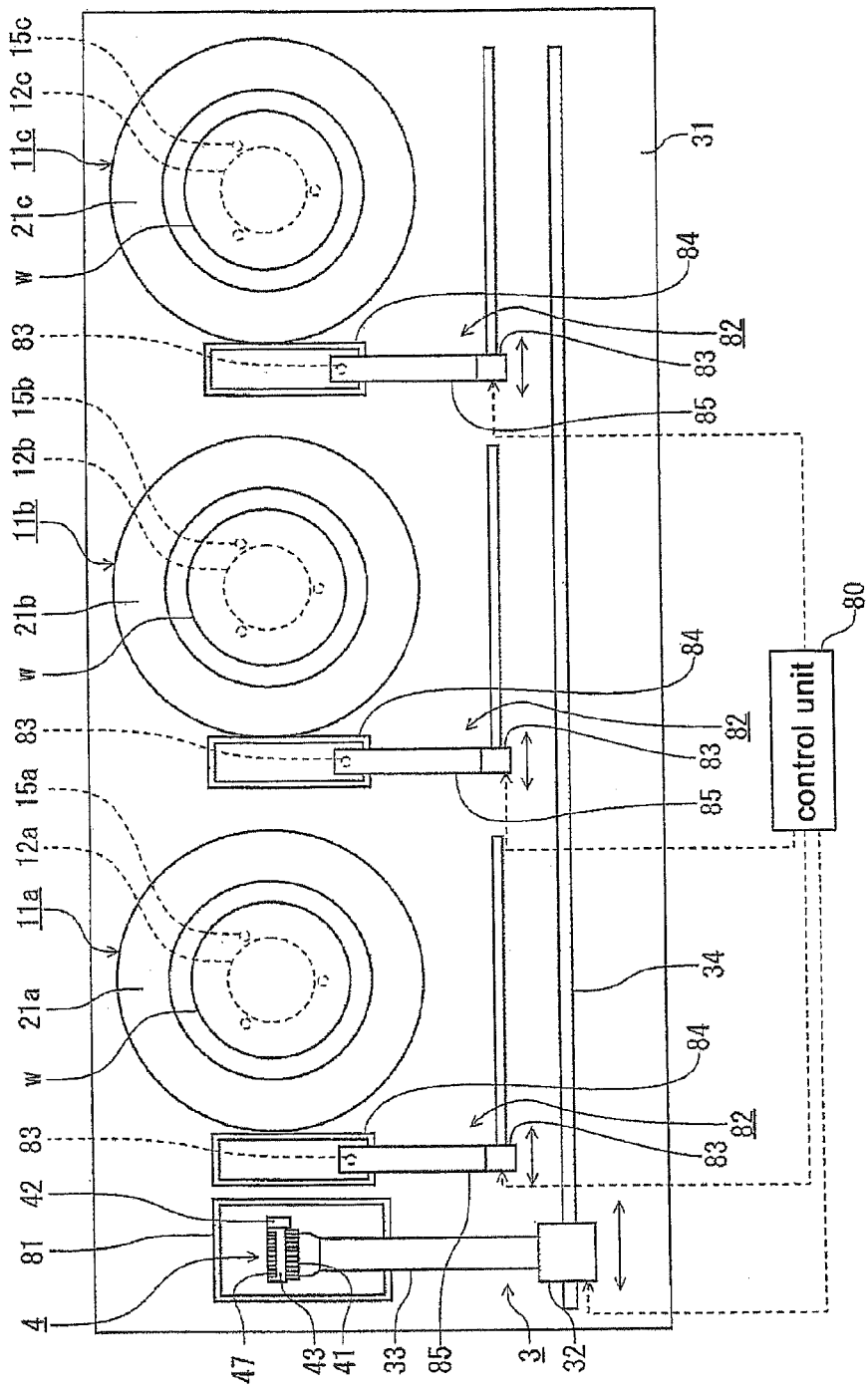
FIG. 2 is a plan view of the resist application apparatus as shown in FIG. 1.

Referring to FIGS. 1 and 2, descriptions will be made for a resist application apparatus 1 equipped with a chemical liquid discharge nozzle, according to the present disclosure. Resist application apparatus 1 includes three application process units 11*a*, 11*b*, 11*c* and a base 31, and resist supply unit 3 is supported by base 31. Application process units 11*a*, 11*b*, 11*c* are aligned with a single line on base 31 along with the transverse direction.

Each of application process units 11*a*, 11*b*, 11*c* is constituted similarly to each other, and descriptions will be made for application process unit 11*a*, taking as an example, by referring to FIG. 3 which illustrates a longitudinal section of the application process unit. Application process unit 11*a* is equipped with a spin chuck 12*a* that holds wafer W on a horizontal direction by adsorbing the center portion of the back side of wafer W, and spin chuck 12*a* is connected to a rotation driving mechanism 14*a* through a rotational shaft 13*a*. Spin chuck 12*a* is configured to rotate around a vertical shaft by holding wafer W through rotation driving mechanism 14a, which controls the number of rotation of spin chuck 12a under the control of a control unit 80. Descriptions for control unit 80 will be followed.

A cup 21a having an opening 20a on the upper side is provided near spin chuck 12a so as to surround wafer W, and the bottom portion of cup 21a is provided with a liquid accommodating unit 23a having, for example, a concave shape. Liquid accommodating unit 23a is divided into an inner area and an outer area by a partition wall 24a along the entire circumference of the lower periphery of wafer W. The bottom portion of the outer area is provided with a liquid draining opening 25a, and the bottom portion of the inner area is provided with an exhaust opening 26a to exhaust the process environment. Element number 15a denotes an elevating pin configured to elevate in up and down and three elevating pins are provided inside cup 21a, though only two pins are illustrated in FIG. 3 for clarity. An elevating mechanism 16a elevates elevating pin 15a according to the operation of a substrate transfer means (not shown) that transfers wafer W to resist application apparatus 1, and wafer W is transferred between the substrate transfer means and spin chuck 12a.

Each of application process units 11b, 11c is illustrated in the figures by using the same number as application process unit 11a, but using symbol b and c, rather than symbol a.

The constitution of resist supply unit 3 is described hereinafter. Resist supply unit 3 is a resist supply means to wafer W, common to application process units 11a, 11b, 11c. Resist supply unit 3 is equipped with a driving mechanism 32 provided in base 31, an arm 33 is extended from driving mechanism 32 along the horizontal direction, and a complex nozzle unit 4 is provided at the front end of arm 33. A guide 34 is provided on base 31 along the alignment direction of application process units 11a, 11b, 11c. Driving mechanism 32 moves along guide 34, and complex nozzle unit 4 is configured to be elevated by driving mechanism 32 via arm 33. With these features, complex nozzle unit 4 is able to be moved to each application process units 11a, 11b, 11c in a predetermined height from wafer W.

Figure 4:
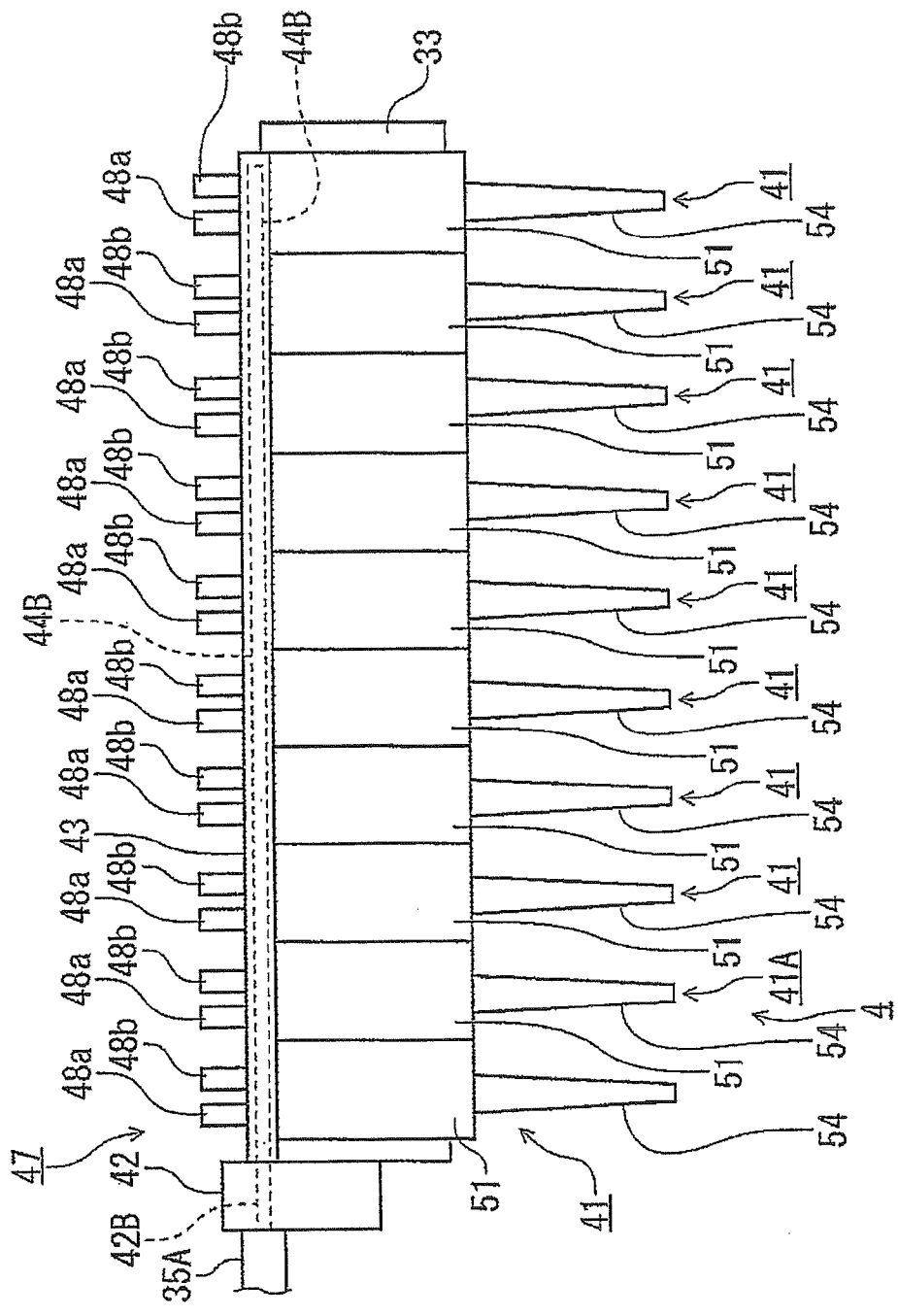
FIG. 4 is a front view of a complex nozzle unit of a resist supply unit.

FIG. 4 illustrates the front side of the front end of arm 33, and complex nozzle 4 is equipped with nine resist supply nozzles 41 that supply nine different resists each having different concentration and component and a thinner supply nozzle 41A. Each resist supply nozzle 41 and thinner supply nozzle 41A, which are a chemical liquid supply nozzle, are aligned horizontally parallel to the movement direction of arm 33, and detachable from arm 33. Thinner supply nozzle 41A has similar structure to resist supply nozzle 41 except that the chemical liquid to be supplied is thinner rather than resist, and performs similar discharge operation to resist supply nozzle 41. Descriptions will be made with respect to resist supply nozzle 41 hereinafter.

Complex nozzle unit 4 is equipped with a tube connection unit 42 provided at the side of the front end of arm 33, and an air flow path forming unit 43 which is a plate-shape and extended from tube connection unit 42 onto each resist supply nozzle 41 with the horizontal direction. Tube connection unit 42 and air flow path forming unit 43 are constructed with a manifold structure having an air flow path branched to multiple paths to supply and exhaust air with respect to each resist supply nozzle 41 and thinner supply nozzle 41A.

Figure 3:
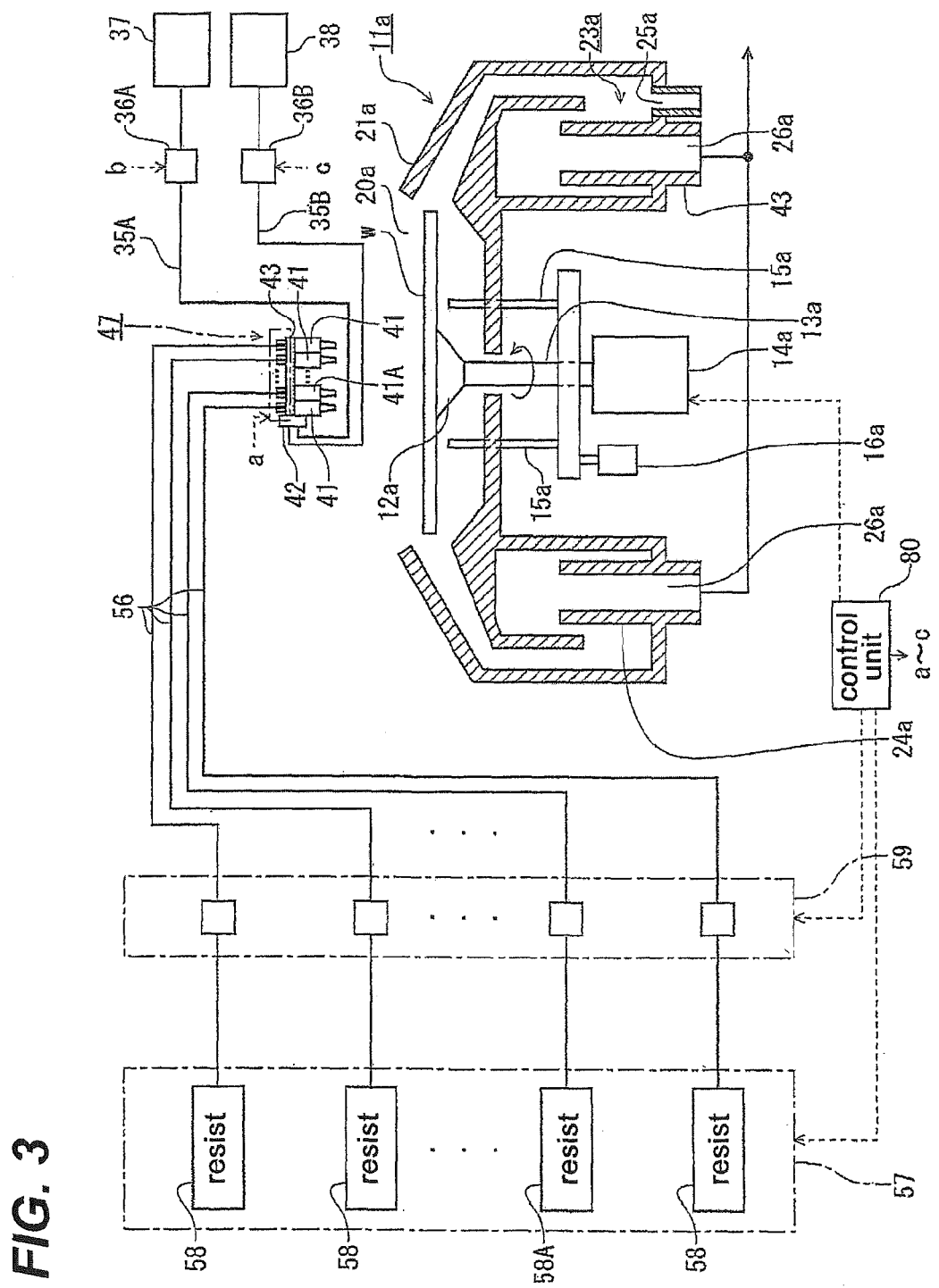
FIG. 3 is a schematic diagram of an application process unit of the resist application apparatus.

Tube connection unit 42 is provided with air flow paths 42A, 42B each connected to one end of air supply tube 35A and exhaust tube 35B, respectively, as shown in FIG. 3. The other end of air supply tube 35A is connected to an air supply source 37 reserved with air via a flow control unit 36A. The other end of exhaust tube 35B is connected to an exhaust means 38 constituted by, for example, a vacuum pump, through a flow control unit 36B. Each of flow control units 36A, 36B is provided with devices such as a valve and a mass flow controller, and controls each of the amount of air supply to complex nozzle unit 4 and the amount of exhaust from complex nozzle unit 4 under the control signal delivered from control unit 80.

Figure 5:
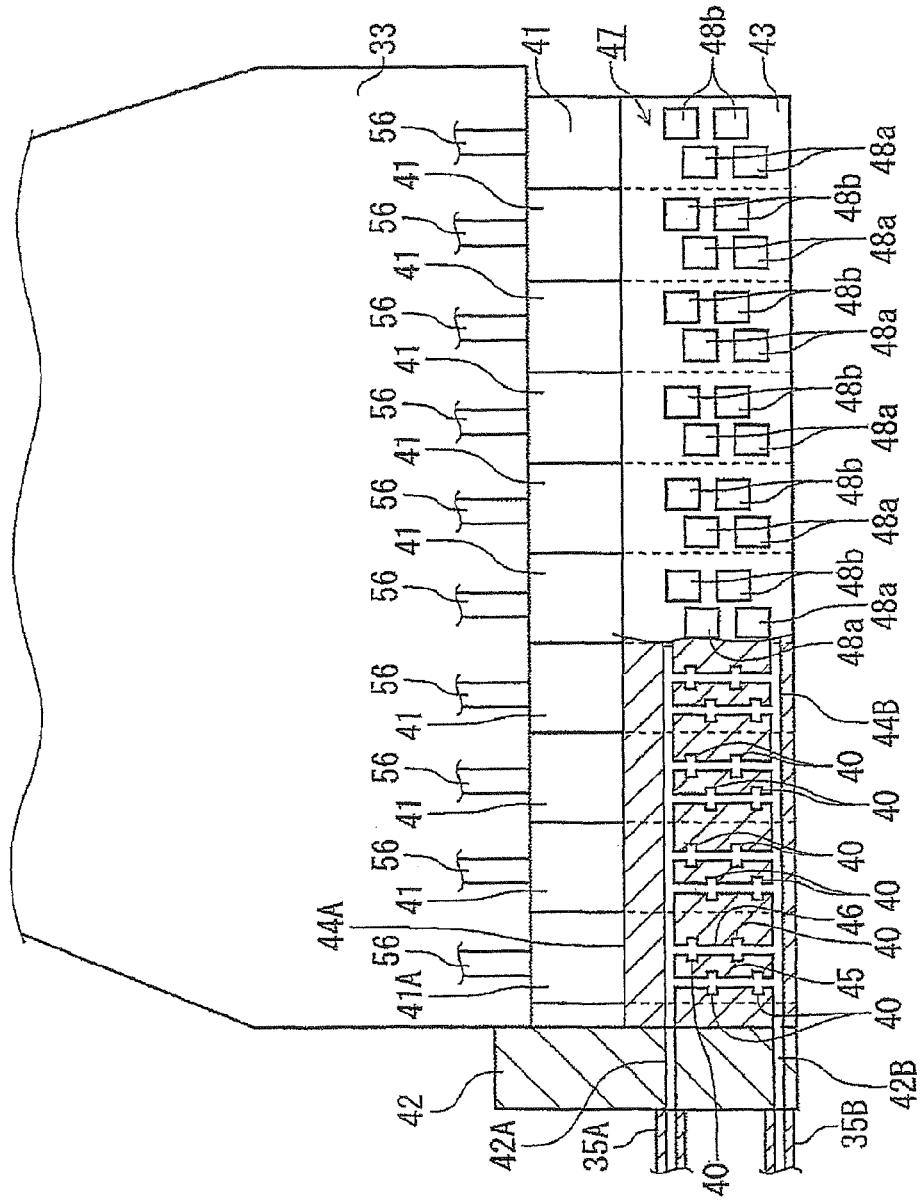
FIG. 5 is a cross-sectional plan view of the complex nozzle unit.

FIG. 5 illustrates a cross-sectional view of air flow path forming unit 43. Air flow path forming unit 43 is, for example, equipped with a main supply flow path 44A and a main exhaust flow path 44B, each connected to air flow paths 42A, 42B of tube connection unit 42, respectively. Each of main supply flow path 44A and main exhaust flow path 44B extends in parallel along the longitudinal direction of air flow path forming unit 43. Also, air flow path forming unit 43 is equipped with air flow paths 45, 46. Two air flow paths 45, 46 are branched from main supply flow path 44A on each resist supply nozzle 41 and thinner supply nozzle 41A, extend toward main exhaust flow path 44B and is connected to main exhaust flow path 44B. Air flow paths 45, 46 are connected to air flow paths 60, 70 of nozzle main body 51 which will be described later. An air flow path cutoff unit 47 constituted by a group of electronic valves is provided on the top of air flow path forming unit 43, and two electronic valves are provided on the top of air flow paths 45, 46 along the forming direction of air flow paths 45, 46. For example, each of electronic valves 48a, 48b is provided on the top of air flow paths 45, 46, respectively.

Figure 6:
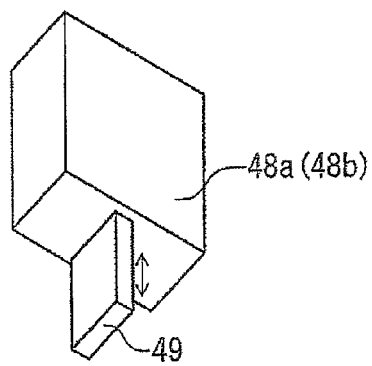
FIG. 6 is a perspective view of an electromagnetic valve provided at the complex nozzle unit.

As illustrated in FIG. 6, air flow path cutoff unit 49 is provided at the lower portion of electronic valves 48a, 48b. Each air flow path cutoff unit 49 is elevated independently according to the control signal transmitted from control unit 80. Referring to FIG. 5, a width-extension part 40 provided in air flow path 45, 46 constitutes as an introduction path of air flow path cutoff unit 49. The connection and cutoff with air flow path 60, main supply flow path 44A and main exhaust flow path 44B are controlled by electronic valve 48a. Also, the connection and cutoff with air flow path 70, main supply flow path 44A and main exhaust flow path 44B are controlled by electronic valve 48b.

Figure 7:
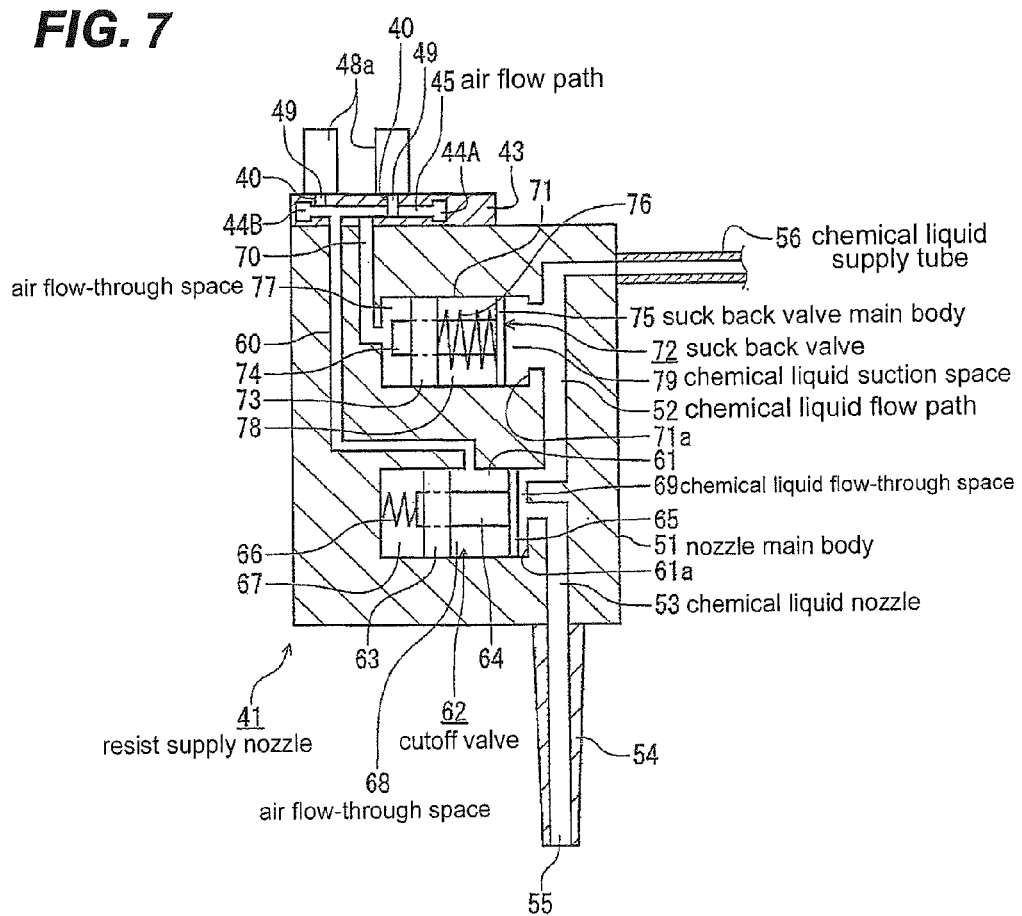
FIG. 7 is a longitudinal plan view of a side face of the resist supply nozzle that constitutes the complex nozzle unit.
Figure 8:
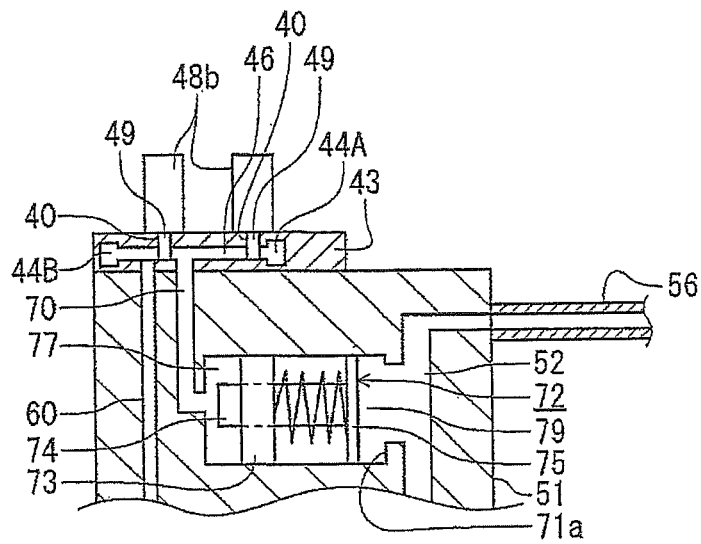
FIG. 8 is a longitudinal plan view of a side face of the resist supply nozzle that constitutes the complex nozzle unit.
Figure 9:
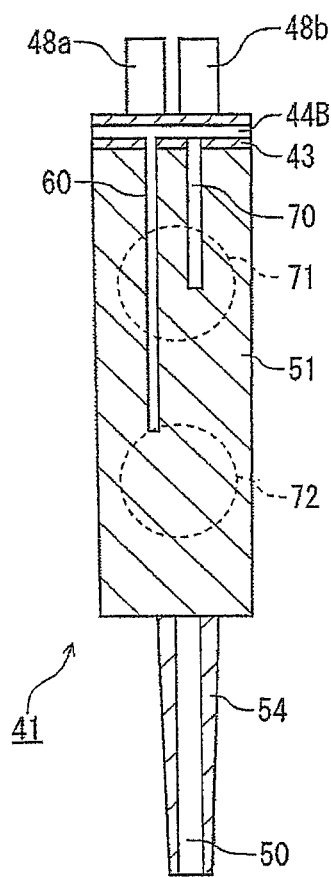
FIG. 9 is a longitudinal plan view of a front face of the resist supply nozzle.

FIGS. 7 and 8 each illustrates the cross-sectional view of air flow path 45 and air flow path 46, respectively. Resist supply nozzle 41 is equipped with, for example, a nozzle main body 51 which is a tetragonal shape. A chemical liquid flow path 52 is formed in nozzle main body 51, and chemical liquid flow path 52 extends toward the lower side of nozzle main body 51 and then bends to extend toward the front side (the left side of FIG. 7) of resist supply nozzle 41. Also, chemical liquid flow path 53 is provided at the lower side of chemical liquid flow path 52. Chemical liquid flow path 53 is formed extending toward the rear side (the right side of FIG. 7) of the nozzle main body 51 and then bending to extend toward the lower side thereof and is connected to a discharge opening 55 of nozzle front-end part 54 formed at the lower side of nozzle main body 51.

Figure 10:
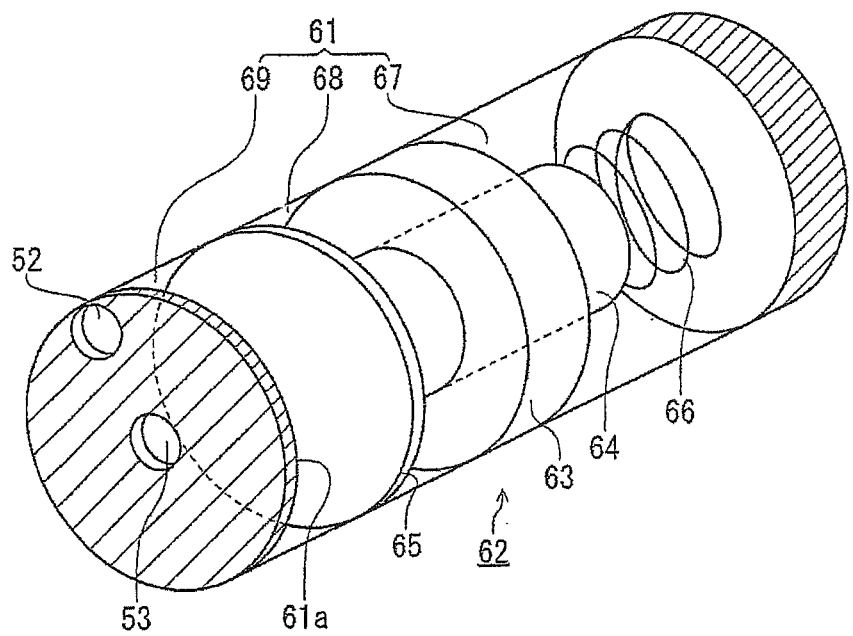
FIG. 10 is a perspective view of a suction unit provided at the resist supply nozzle.

In nozzle main body 51, a cylindrical-shaped space 61 is formed extending to the forward-backward direction of nozzle main body 51, and a downstream end of chemical liquid flow path 52 and an upstream end of chemical liquid flow path 53 are connected to space 61. Also, a cutoff valve 62 is provided in space 61 to cutoff the resist flow in nozzle main body 51. Descriptions will be made for cutoff valve 62 by referring to FIG. 10. Cutoff valve 62 is constituted with a ring member 63, a cylindrical cylinder 64, a cutoff valve main body 63 and a spring 66.

Ring member 63 is fixed to space 61 so as to divide space 61 in a rear and front directions of resist supply nozzle 41, and a space 67 is formed at the front end (the left side of FIG. 7)

of ring member 63. Cylindrical cylinder 64 is inserted into ring member 63 along the forward-backward direction of resist supply nozzle 41, and a disc-shaped cutoff valve main body 65 is provided to be fixed into cylinder 64 at the front end of cylinder 64 of chemical liquid flow path 52, 53 side. Spring 67 is provided in space 67 to always press cylinder 64 and cutoff valve main body 65 toward the front side of resist supply nozzle 41. Also, in space 61, an air flow-through space (a first fluid flow-through space) 68 is formed in a space between ring member 63 and cutoff valve main body 65, and air flow-through space 68 is separated from space 67.

Air flow-through space 68 is connected to air flow path 45 of air flow path forming unit 43 via air flow path 60 that forms first common fluid flow path formed into an up and down direction of nozzle main body 51. When air flow-through space 68 is in a static and normal pressure, by the pressing force of spring 68, cutoff valve main body 65 is pressed toward wall 61a that forms space 61. As a result, the downstream end of chemical liquid flow path 52 and the upstream end of chemical liquid flow path 53 are clogged, thereby shutting off the resist flow-through between chemical liquid flow paths 52, 53. When air flow-through space 68 is in a negative pressure by the exhaustion from air flow path 60, cylinder 64 and cutoff valve main body 65 are moved against the pressing force of spring 68 toward the front side of resist supply nozzle 41, thereby reducing the volume of air flow-through space 68 and separating cutoff valve main body 65 from wall surface 61a. With these operations, chemical fluid flow-through space 69 is formed which is divided from air flow-through space 68 in between cutoff valve main body 65 and wall 61a, and chemical liquid flow paths 52, 53 are connected through chemical fluid flow-through space 69.

Figure 11:
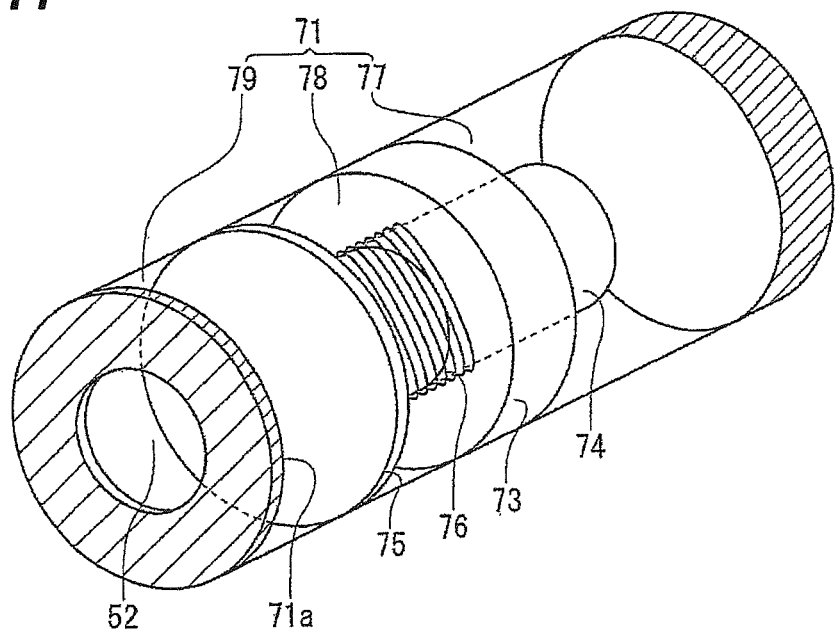
FIG. 11 is a perspective view of a cutoff valve provided at the resist supply nozzle.
Figure 12:
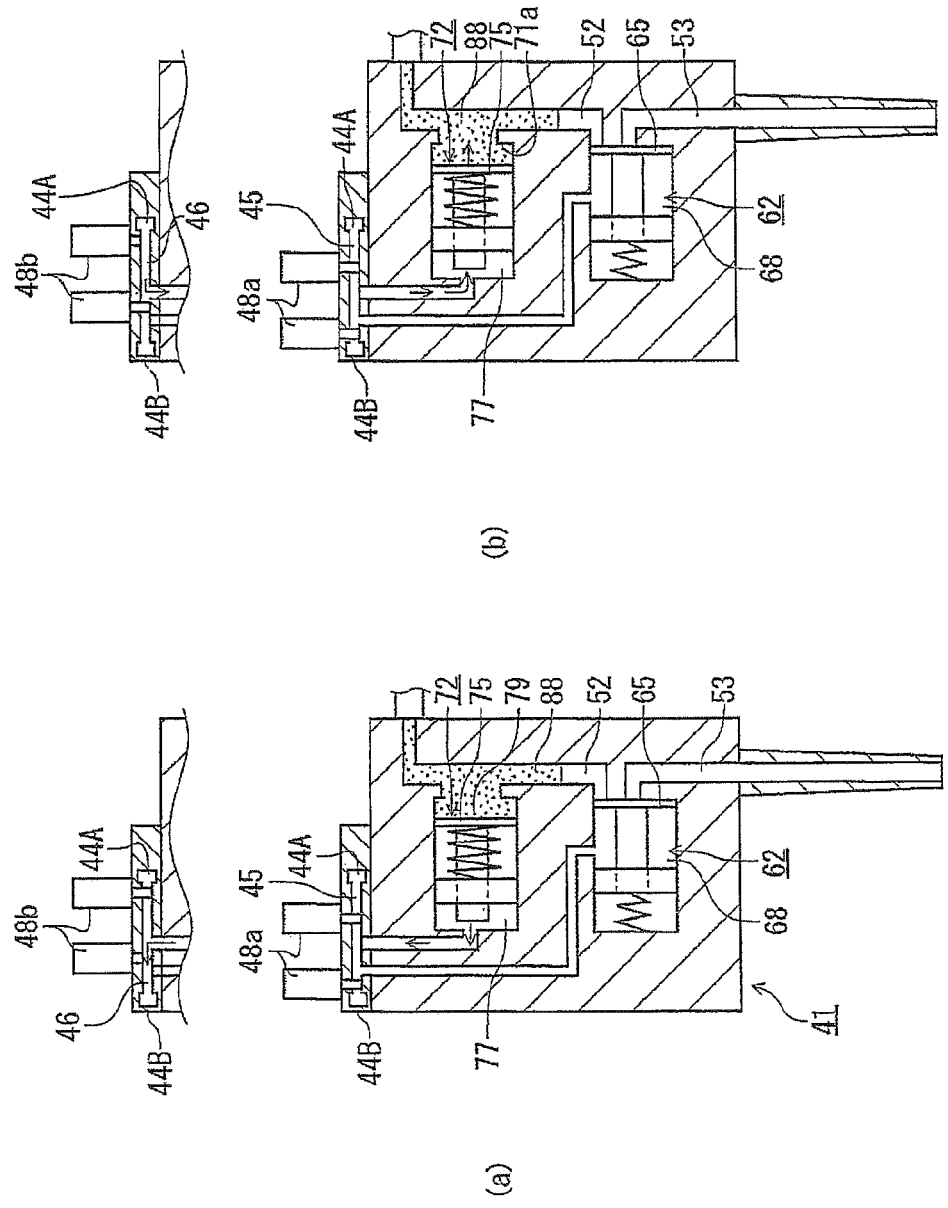
FIG. 12a and FIG. 12b each is a process diagram illustrating the operation of the resist supply nozzle.
Figure 13:
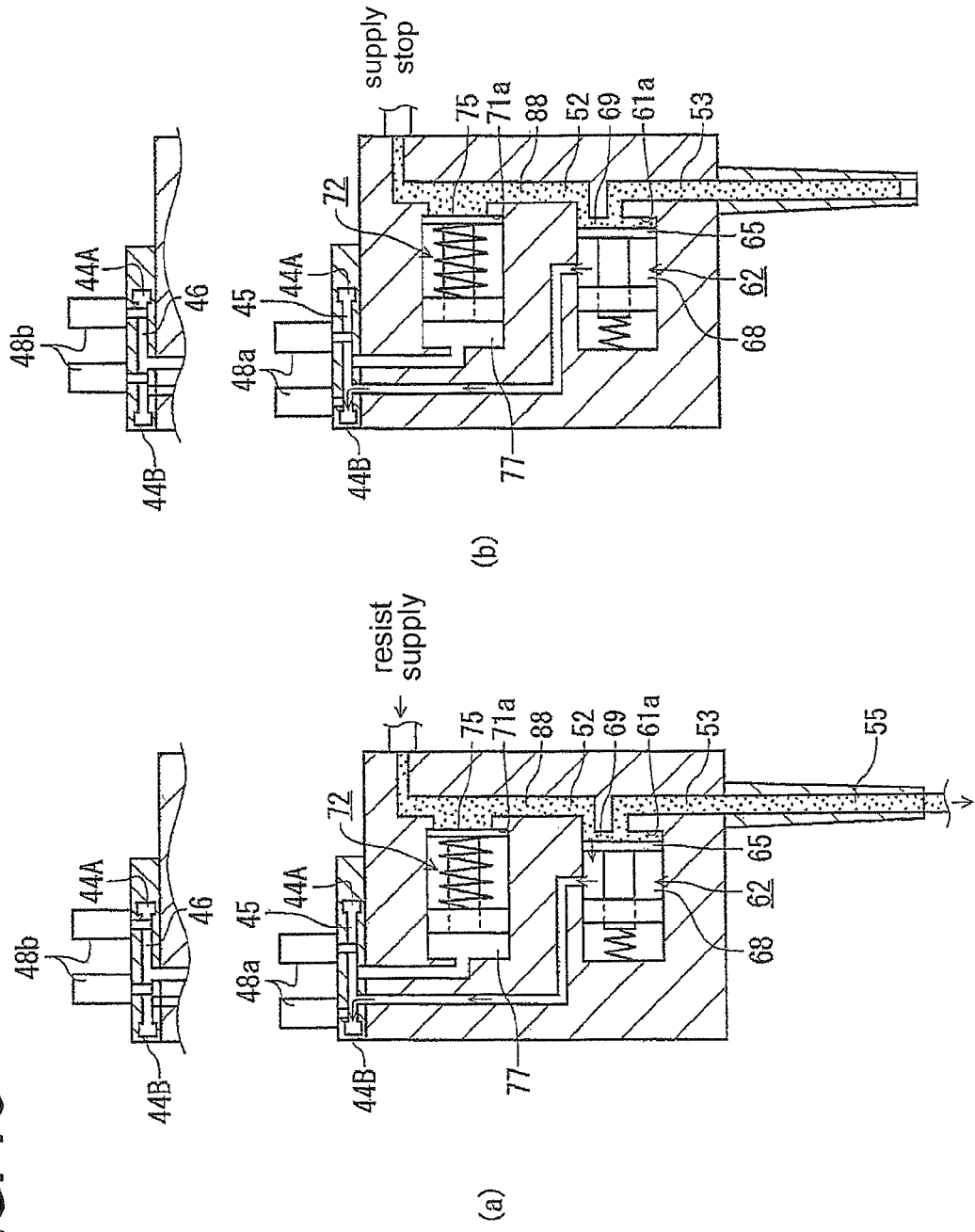
FIG. 13a and FIG. 13b each is a process diagram illustrating the operation of the resist supply nozzle.
Figure 14:
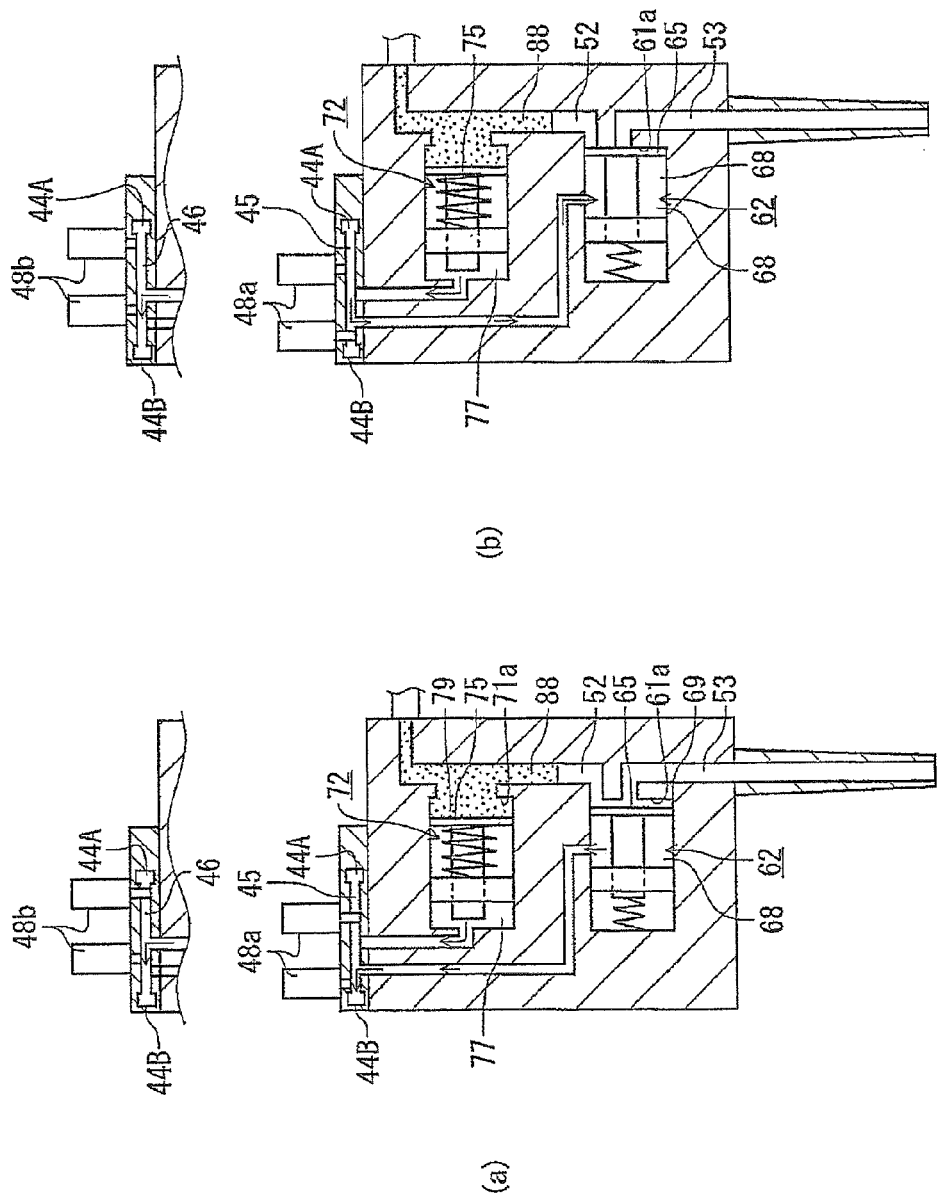
FIG. 14a and FIG. 14b each is a process diagram illustrating the operation of the resist supply nozzle.

In nozzle main body 51, a cylindrical space 71, extending along the forward and backward direction of nozzle main body 51, is formed at the front side of chemical liquid flow path 52, and a suck back valve 72 is provided in cylindrical space 71 forming a suction unit of the chemical liquid. Referring to FIG. 11, suck back valve 72 includes a ring member 73, a cylinder 74, suck back valve main body 75 and a spring 76.

Ring member 73 is fixed to space 71 so as to divide resist supply nozzle 41 along the forward and backward direction, and the space formed at the front side (the left side of FIG. 7) of ring member 73 is regarded as an air flow-through space 77 (a second fluid flow-through space). A cylindrical-shape cylinder 74 is inserted to ring member 73 along the forward and backward direction of resist supply nozzle 41, a disc-shape suck back valve main body 75 is provided to be fixed to cylinder 74 at the front end of cylinder 74 of the side of chemical liquid flow path 52. In space 71, the space formed between ring member 73 and suck back valve main body 75 is regarded as space 78, which is divided from air flow-through space 77. Also, spring 76 is provided in space 78, and cylinder 74 and suck back valve main body 75 are always pressed to the front side of resist supply nozzle 41 due to spring 76.

Air flow-through space 77 is connected to air flow path 45 of air flow path forming unit 43 through air flow path 70 that forms a second common fluid flow path, that is again formed toward the up and down direction of nozzle main body 51. When air flow-through space 77 is in a static and normal pressure, suck back valve main body 75 is pressed hard to wall 71a, and the resist in chemical liquid suction space 79 is discharged to the downstream side. When air flow-through space 77 is in a negative pressure by the exhaustion from air flow path 70, cylinder 74 and suck back valve main body 75 are moved to the front side of resist supply nozzle 41, the volume of air flow-through space 77 is decreased, and suck back valve main body 75 is separated from wall 71a. As a result, chemical liquid suction unit space 79 is formed divided from space 78 in between suck back valve main body 75 and wall 71a. The resist remaining in chemical liquid flow path 52 at the downstream side as compared to chemical liquid suction space 79, chemical liquid space 53, chemical liquid flow-through space 69 and discharge opening 55, is sucked in chemical liquid suction space 79.

One end of chemical liquid supply tube 56 that forms a flow path member for supplying resist is connected to chemical liquid flow path 52, and the one end is detachable from nozzle main body 51. As illustrated in FIG. 3, the other end of chemical liquid supply tube 56 is connected to a chemical liquid supply unit 57 formed with a tank reserved with resist to be supplied to each resist supply nozzle 41 and resist supply mechanism 58 equipped with a liquid transfer means to transfer resist in the tank to the nozzle. Nine (9) resist supply mechanism 58 is provided which is the same number as resist supply nozzle 41. As a result, the kind of resist supplied to wafer W may be changed by converting resist supply nozzle 41 to be used.

Also, chemical liquid supply unit 57 is equipped with a thinner supply mechanism 58A that supplies thinner to thinner supply nozzle 41A through chemical liquid supply tube 56, and thinner supply mechanism 58A is constructed similarly to resist supply mechanism 58. Each chemical liquid supply tube 56 is provided with flow control unit 59 which includes, for example, a valve or mass flow controller, and flow control unit 59 controls the supply amount of the chemical liquid to each nozzle according to the control signal from control unit 80.

Referring back to FIGS. 1 and 2, a nozzle bath 81 is provided at one end of the longitudinal direction of base 31, and is formed with a cup shape having an opening on the top side. Complex nozzle unit 4 is in a stand by state inside nozzle bath 81 when complex nozzle unit 4 does not process wafer W. Also, resist application apparatus 1 is equipped with three of a circumference edge removing mechanism 82 each is configured to remove the circumference of the edge of the resist formed at each of application process units 11a, 11b, 11c and prevent the detachment of the resist layer. Circumference edge removing mechanism 82 is equipped with a thinner supply nozzle 83 that supplies thinner which is a resist solvent, and thinner supply nozzle 83 is configured to be moveable between the upper side of the circumference of the edge of wafer W and nozzle bath 84 provided in the side of each cup 21a, 21b, 21c. In the figures, numeral 85 denotes an arm and numeral 86 denotes a driving unit that elevates the arm and moves itself along the longitudinal direction of base 31.

Control unit 80 constituted by a computer is provided in resist application apparatus 1. Control unit 80 is equipped with a data processing unit constituted by a program, a memory, and a CPU. The program includes commands (each step) to conduct each of the processes described above by sending control signals from control unit 80 to each unit of resist application apparatus 1. Also other control operations such as, for example, the rotation of wafer W by rotation driving mechanism 14a or the transfer of wafer W by elevating pin 15a, the air supply to each space of nozzle main body 51 by the flow control unit and exhaustion from each space, and the opening and closing of the air flow path by air flow path cutoff unit 47. The program including the input operation of process parameters and display is stored in a computer memory medium such as a flexible disk, compact disk, hard disk, magnetic optical disk memory card, thereby being installed into control unit 80.

Referring to FIGS. 12, 13, 14, 15, descriptions will be made for the resist application process of wafer W by resist application apparatus 1 as described above. Each of FIGS. 12, 13, 14 and 15 illustrates air flow path 45 and air flow path 46 in the lower and upper sides of the figures, respectively, to explain the supply and exhaustion of air in each space. First, for example, a user pre-sets various conditions with respect to each wafer W transferred to resist application apparatus 1, regarding, for example, which application process unit will be used out of application process units 11a, 11b, 11c, and which resist will be used out of resist supply mechanism 58. Subsequently, wafer W is transferred to one of application process units 11a, 11b, 11c sequentially by a transfer means (not shown). While wafer W is processed similarly in each of application process units 11a, 11b, 11c, descriptions will be made for the case of application process unit 11a hereinafter.

Wafer W is transferred from the transfer means to spin chuck 12a via elevating pin 15a, and the center portion of the bottom side of wafer W is adsorbed and maintained on spin chuck 12a. Subsequently, wafer W is rotated along a vertical shaft with a predetermined number, for example, 100 rpm, and complex nozzle unit 4 in a stand-by state in nozzle bath 81 is elevated from nozzle bath 81. Complex nozzle unit 4 is then moved horizontally on to wafer W and thinner supply nozzle 41A is located at the center of wafer W. When complex nozzle unit 4 is descended and positioned on top of wafer W with a predetermined height, thinner is discharged to the center of wafer W, and the thinner is dispersed to the edge area of wafer W by the centrifugal force. As such, thinner is applied to the entire surface of wafer W by a so-called a spin coating, and the wettability of the resist is increased on wafer W.

Continuously, complex nozzle unit 4 is moved horizontally, and resist supply nozzle 41 set to process wafer W is positioned on top of the center of wafer W. FIG. 12a illustrates the appearance of each resist supply nozzle 41. In main supply flow path 44A of flow path forming unit 43, air is supplied and main exhaust flow path 44B is exhausted. Air flow-through space 68 is spaced from main supply flow path 44A and main exhaust flow path 44B by electronic valve 48a and maintained at a normal pressure, and cutoff valve 62 blocks the gap between chemical liquid flow paths 52, 53.

Also, air flow-through space 77 is connected to main exhaust flow path 44B and blocked from main supply flow path 44A by electronic valve 48b. As a result, air flow-through space 77 is exhausted to be maintained at a negative pressure. Due to this operation, suck back valve main body 75 is retreated from chemical liquid flow path 52, and resist 88 adsorbed in chemical liquid suction space 79 is reserved. Then, resist 88 is removed at chemical liquid flow path 53 and discharge opening 55. The operation of cutoff valve 62 and suck back valve 72 will be described later only for resist supply nozzle 41 positioned at an upper portion of the center of wafer W.

The rotation counts of wafer W is increased, for example, 2000 rpm~3000 rpm, air flow-through space 77 and main exhaust flow path 44B are blocked, and air flow-through space 77 is connected to main supply flow path 44A. The air is introduced from main supply flow path 44A to air flow-through space 77, thereby making air flow-through space 77 to be a static pressure. Also, suck back valve main body 75 presses resist 88 of chemical liquid suction space 79 to chemical liquid flow path 52 (FIG. 12b).

Next, air flow-through space 77 is blocked from main supply flow path 44A by electronic valve 48b, and air flow-through space 68 is connected to exhaust flow path 44B by electronic valve 48a. Air flow-through space 68 is exhausted to be a negative pressure, cutoff valve main body 65 is retreated from chemical liquid flow paths 52, 53 to form chemical liquid flow-through space 69, and chemical liquid flow paths 52, 53 are connected by chemical liquid flow-through space 69. Also, resist 88 extruded from chemical liquid suction space 79 by suck back valve 72 is discharged from discharge opening 55 through chemical liquid flow path 52.

The pressure of air flow-through space 77 is decreased from a static pressure to a normal pressure by the enlargement of the volume, all of resist 88 is extruded from chemical liquid suction space 79, and chemical liquid suction space is disappeared because suck back valve main body 75 is pressed to wall surface 71a. When the discharge of resist 88 from chemical liquid suction space 79 is completed, resist 88 is supplied approximately simultaneously from resist supply mechanism 58 to resist supply nozzle 41 with a predetermined amount, and the discharge of resist 88 is continued from resist supply nozzle 41 (FIG. 13a). By the centrifugal force, resist 88 discharged to the center portion of wafer W is dispersed quickly to the circumferential edge of the surface of wafer W wet by thinner, thereby applying resist 88 to the entire surface of wafer W.

Subsequently, the supply of the resist from resist supply mechanism 58 to resist supply nozzle 41 is stopped (FIG. 13b), air flow-through space 77 and main exhaust flow path 44B is connected by electronic valve 48b, thereby exhausting air flow-through space 77 to maintain the pressure with a negative pressure. Suck back valve main body 75 is retreated from chemical liquid flow path 52 to form chemical liquid suction space 79 again, and resist 88 at the downstream side of chemical liquid suction space 79 is sucked into chemical liquid suction space 79, thereby removing resist 88 at discharge opening 55, chemical liquid flow path 53 and chemical liquid flow-through space 69 (FIG. 14a).

Figure 15:
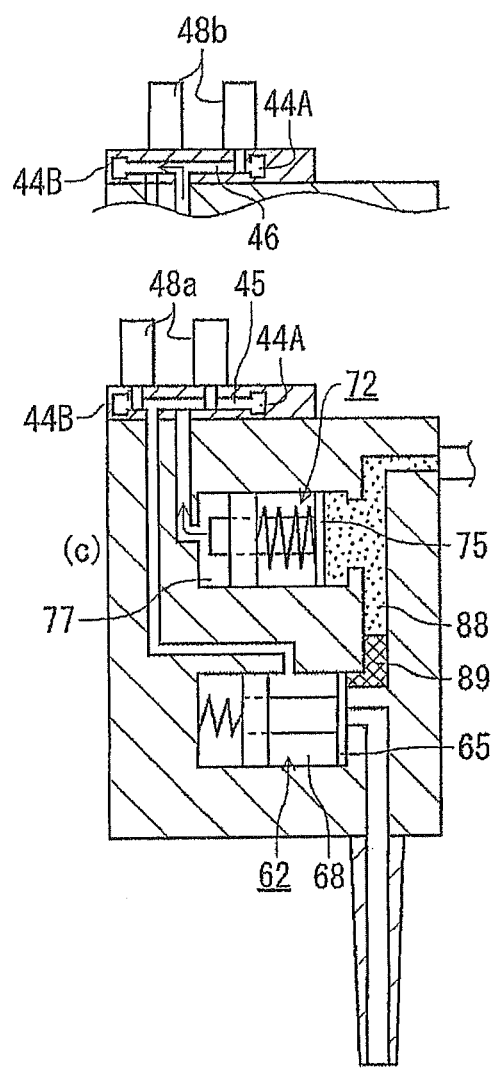
FIG. 15 is a process diagram illustrating the operation of the resist supply nozzle.

Subsequently, air flow-through space 68 is blocked from main exhaustion flow path 44B by electronic valve 48a and connected to main supply flow path 44A. Air is supplied from main supply flow path 44A to air flow-through space 68 and the pressure of air flow-through space 68 becomes a normal pressure. Due to this, cutoff valve main body 65 is tightly attached to wall surface 61a so that chemical liquid flow-through space 69 disappears and chemical liquid flow paths 52, 53 are blocked to each other (FIG. 14b). Also, air flow-through space 68 is blocked from main supply flow path 44A by electronic valve 4a and the supply of air to air flow-through space 68 is stopped. The solvent included in resist 88 residing in chemical liquid flow path 53 is evaporated, and resist 88 of the downstream side of space 89 becomes a solvent environment in chemical liquid flow path 53. In FIG. 15, space 89 that becomes the solvent environment is illustrated in a mesh-shaped.

Complex nozzle unit 4 returns to nozzle bath 81 performing an opposite operation as compared to moving to application process unit 11a. And after the rotation counts of wafer W is decreased, and resist 88 supplied to wafer W is dried out, thinner supply nozzle 83 in the stand-by state at nozzle bath 84 is elevated and is moved to the circumferential edge of wafer W of application process unit 11a. Next, thinner supply nozzle 83 is descended to a predetermined height from wafer W and then supplies thinner to the circumferential edge of wafer W. As a result, a resist layer is removed at the circumferential edge of wafer W. Subsequently, thinner supply nozzle 83 returns to nozzle bath 84 and the rotation of wafer W is stopped. Wafer W is then transferred to the transfer means via the elevating pin and taken out from resist application apparatus 1.

According to resist supply nozzle 41 of the first embodiment, cutoff valve 62 is provided in nozzle main body 51 to which chemical liquid supply tube 56 is connected, blocking the space between chemical liquid flow path 52 of the upstream side and chemical liquid flow path 53 of the downstream side. Resist supply nozzle 41 is also equipped with suck back valve 72 that sucks the resist in the upstream side of cutoff valve 62. As described above, after discharging the resist and sucking resist in chemical liquid flow path 52, the space between chemical liquid flow paths 52, 53 is blocked. As a result, the resist in chemical liquid flow path 52 is separated from the atmospheric environment of outside resist supply nozzle 41. Also, chemical liquid flow path 52 becomes a solvent environment, the drying of the resist is suppressed. Accordingly, as described in the background section, there is no need to suck the thinner at the front end of the nozzle, and the number of cleaning of resist supply nozzle 41 by thinner and dummy dispense can be decreased, thereby reducing the overall cost for the resist application process. Moreover, the dropping of the resist from the flow path of resist supply nozzle 41 is suppressed while resist supply nozzle 41 is moving, thereby suppressing the decreasing of the yield of products.

Also, since cutoff valve 62 and suck back valve 72 are operated by air, amounts of heats are reduced as compared to a case where cutoff valve 62 and suck back valve 72 are operated by the electric power. This further suppresses the drying of the resist in chemical liquid flow path 52.

Also, in resist supply nozzle 41, the supply and stop of the resist to wafer W is controlled by cutoff valve 62 provided in resist supply nozzle 41. As a result, the control of the discharge timing is relatively easy as compared to a case where such cutoff valve 62 is provided in chemical liquid supply tube 56 because the timing error is relatively small between the discharge operation of the resist and the supply time of the resist to wafer W. Also, since cutoff valve 62 and suck back valve 72 are provided in nozzle main body 51, the amount of resist sucked to prevent the drying is suppressed. Accordingly, a throughput may also be improved because the time until the resist is discharged to wafer W after a previous wafer W is processed, is relatively shorter.

Second Embodiment

Figure 16:
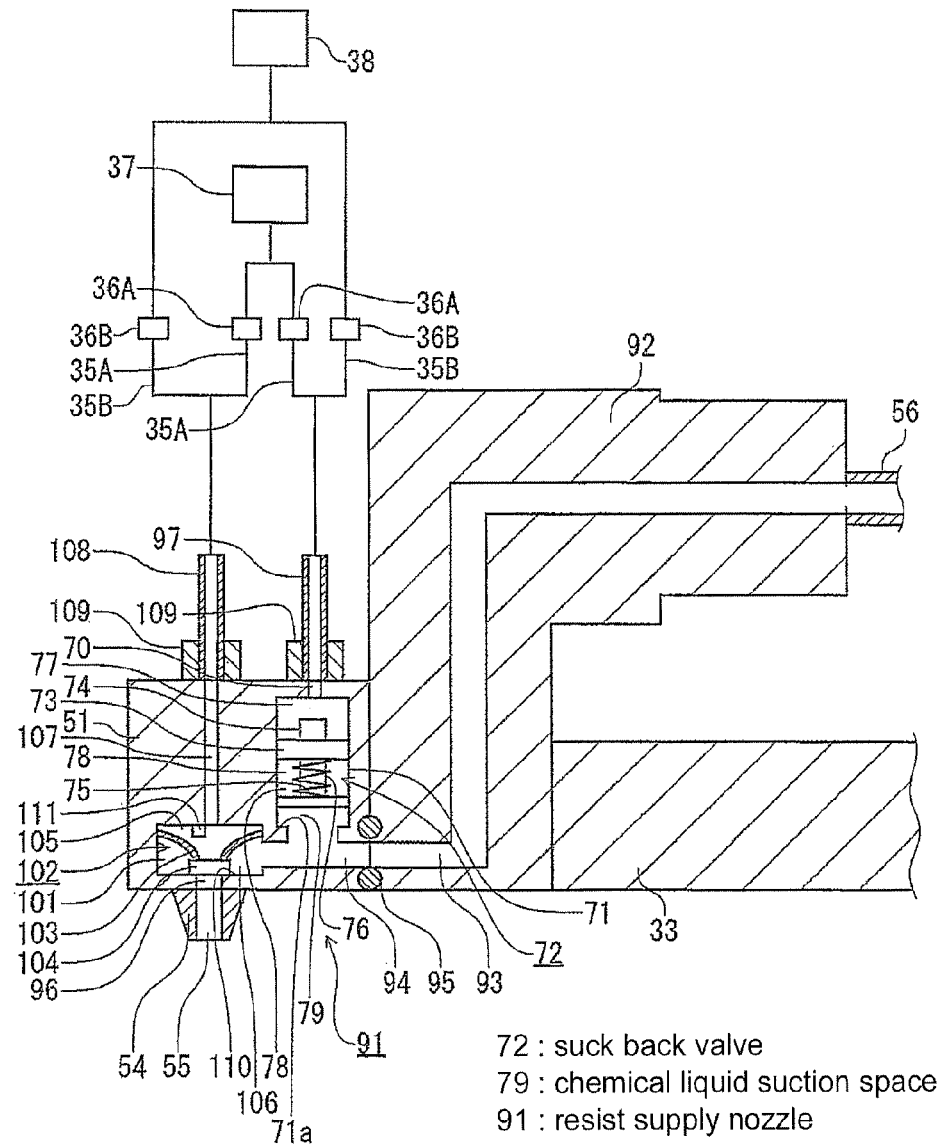
FIG. 16 is a longitudinal plan view of a side face of another resist supply nozzle.

Referring to FIG. 16, resist supply nozzle 91 of the second embodiment will be described with regard mainly to the difference as compared to resist supply nozzle 41. Same numerals are used in resist supply nozzle 91 for the same elements in resist supply nozzle 41. Resist supply nozzle 91 is fixed to the front end of arm 33 via chemical liquid flow path forming unit 92, and detachable from chemical liquid flow path forming unit 92.

Chemical liquid flow path 93 is formed in chemical liquid flow path forming unit 92, and chemical liquid supply tube 56 is connected to the upstream side of chemical liquid flow path 93. In nozzle main body 51 of resist supply nozzle 91, a chemical liquid flow path 94 is formed in a transverse direction, and the upstream side of chemical liquid flow path 94 is connected to chemical liquid flow path 93. Chemical liquid flow path forming unit 92 and resist supply nozzle 91 are connected through a ring-type seal member provided to surround chemical liquid flow paths 93, 94. Seal member 95 may be, for example, an o-ring or a packing.

A space 71 may be formed at the upper side of chemical liquid flow path 94, and space 71 is connected to chemical liquid flow path 93. Space 71 is similarly constructed to the first embodiment except that space 71 is formed in a cylindrical shape extending to the up and down direction, and a suck back valve 72 is provided inside space 71. Air flow-through space 71 that forms an upper portion of space 71 is connected to an end of air flow-through tube 97 through flow path 70. The other end of air flow-through tube 97 is branched to form an air supply tube 35A and an exhaust tube 35B each provided with flow control units 36A, 36B.

The downstream end of chemical liquid flow path 94 is connected to a space 101 having a flat disk shape, and chemical liquid flow path 96 is connected to the center lower portion of space 101. Chemical liquid flow path 96 has a cylindrical shape having a smaller diameter than space 101, forms nozzle main body 51 along the up and down direction, and the lower side thereof is connected to discharge opening 55.

A cutoff valve 102 is provided in space 101, and FIG. 17 illustrates a perspective view of cutoff valve 102. A diaphragm 103, a flexible membrane having a ring shape, is provided facing downward center from the side wall of space 101. The diameter of diaphragm 103 is, for example, approximately 10 mm, and the diameter of a hole in the center is, for example, 1 mm. A cutoff valve main body 104 having a disk shape is provided at the center of diaphragm 103 to close the hole. By diaphragm 103 and cutoff valve main body 104, space 101 is divided into an air flow-through space 105 that forms an upper side of space 101 and a chemical liquid flow-through space 106 that forms a lower side of space 101, and chemical liquid flow path 94 is connected to chemical liquid flow-through space 106.

One end of air flow path 107 formed along the up and down direction of nozzle main body 51, is connected to air flow-through space 105, and the other end of air flow path 107 is connected to an end of air flow-through tube 108. The other end of air flow-through tube 108 is branched to form an air supply tube 35A and an exhaust tube 35B each provided with flow controller 36A, 36B. Numeral 109 denotes a joint to connect air flow-through tubes 97, 108 to nozzle main body 51.

The pressure in air flow-through space 105 is controlled by the air supply to and exhaustion from air flow-through tube 108. When the pressure in air flow-through space 105 is higher than the pressure of chemical liquid flow-through space 106, cutoff valve main body 104 is tightly attached to a lower side wall 110 that forms space 101, thereby being divided into chemical liquid flow-through space 106 and chemical liquid flow path 96. Also, when air flow-through space 105 is exhausted and the pressure is lower than that of chemical liquid flow-through space 106, cutoff valve main body 104 is spaced from wall surface 110, thereby communicating chemical liquid flow-through space 106 and chemical liquid flow path 96.

Also, a liquid surface contact sensor 111 is provided in air flow-through space 105 to transmit detecting signal to a control unit 80. When diaphragm is broken and the pressure of air flow-through space 105 is decreased, resist is introduced into air flow-through space 105 to contact with liquid surface contact sensor 111. At this time, the detecting signal transmitted to control unit 80 is changed, and control unit 80 transmits a control signal to an alarm generation unit (not shown), thereby generating an alarm to inform a user. The alarm may be an unusual indication on a display or an alarm sound.

Figure 19:
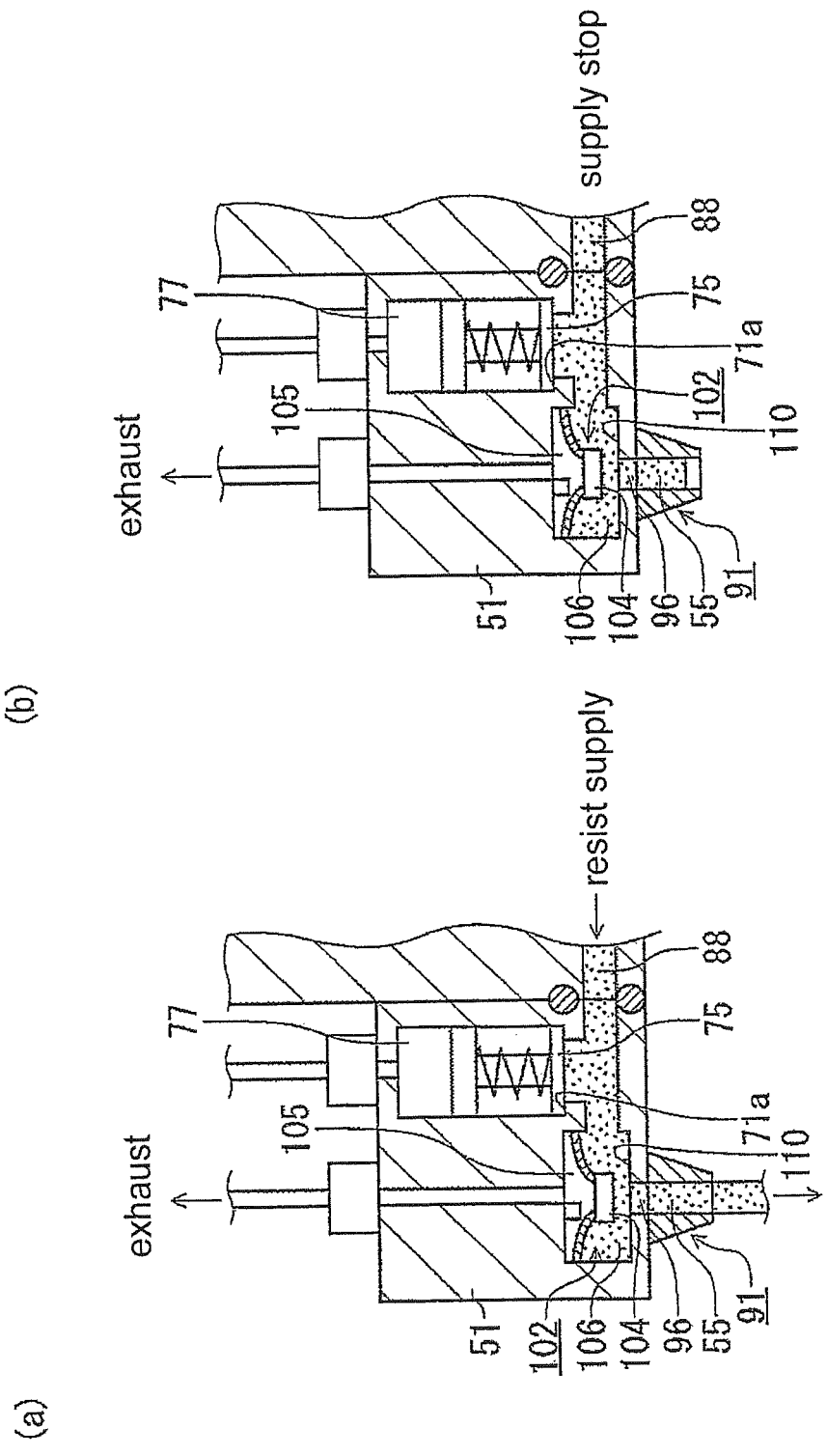
FIG. 19a and FIG. 19b each is a process diagram illustrating the operation of the resist supply nozzle.

Subsequently, the operation of resist supply nozzle 91 will be described by referring to FIGS. 18, 19 and 20. In FIG. 18a, air is supplied to air flow-through space 105, and the pressure is in a normal pressure which is higher than that of chemical liquid flow-through space 106 and which is in a static pressure. As a result, cutoff valve main body 104 is pressed into wall surface 110, and chemical liquid flow path 96 and chemical liquid flow-through space 106 are divided. Air flow-through space 77 is exhausted to become a negative pressure. As a result, suck back valve main body 75 is spaced from wall surface 71a, thereby removing the resist from chemical liquid flow-through space 106, and reserved into chemical liquid suction space 79.

The exhaustion in air flow-through space 77 is stopped and air is supplied to air flow-through space 77 making the pressure in air flow-through space 77 to be a static pressure. Suck back valve main body 75 presses the resist at chemical liquid suction space 79 to resist flow path 94 (FIG. 18b). The air supply to air flow-through space 77 is stopped, and continuously, the air supply to air flow-through space 105 is stopped. Subsequently, air flow-through space 105 is exhausted to become a negative pressure. And, cutoff valve main body 104 is spaced from wall surface 110, and chemical liquid flow path 96 and chemical liquid flow-through space 106 are connected to each other. As a result, resist 88, pressed from chemical liquid suction space 79 and extruded to chemical liquid flow path 96, is provided to wafer W from discharge opening 55 via chemical liquid flow-through space 106 and chemical liquid flow path 96.

And, suck back valve main body 75 is pressed to wall 71a, and resist 88 in chemical liquid suction space 79 is extruded, on the one hand, resist 88 is supplied to resist flow path 94 from resist supply mechanism 58. Resist 88 supplied from resist supply mechanism 58 is supplied to wafer W through discharge opening 55 after resist 88 reserved in chemical liquid suction space 79 (FIG. 19a) is supplied to the wafer.

After that, the supply of resist 88 from resist supply mechanism 58 to resist flow path 94 is stopped (FIG. 19b). Air flow-through space 77 is exhausted to become a negative pressure, and suck back valve main body 75 is spaced from wall surface 71a. As a result, resist 88 of the downstream side of chemical liquid suction space 79 is sucked into chemical liquid suction space 79 located in between suck back valve main body 75 and wall surface 71a. And, resist 88 is removed from discharge opening 55, resist flow path 96 and chemical liquid flow-through space 106 (FIG. 20a).

The exhaustion from air flow-through space 105 is stopped, and air is supplied to air flow-through space 105 making the pressure in air flow-through space 105 to be a static pressure. And, cutoff valve main body 104 is pressed against wall surface 110 thereby blocking chemical liquid flow-through space 106 and resist flow path 96 (FIG. 20b). Subsequently, thinner included in the solvent of resist 88 in resist flow path 94 is evaporated, and chemical liquid flow-through space 106 becomes a thinner atmosphere. In resist supply nozzle 91 as well, suck back valve 72 is provided at the upstream side of the chemical liquid flow path, and cutoff valve 102 is provided at the downstream side of the chemical liquid flow path, respectively. As a result, similar effects to resist supply nozzle 41 may be obtained.

Modified Second Embodiment

Figure 21:
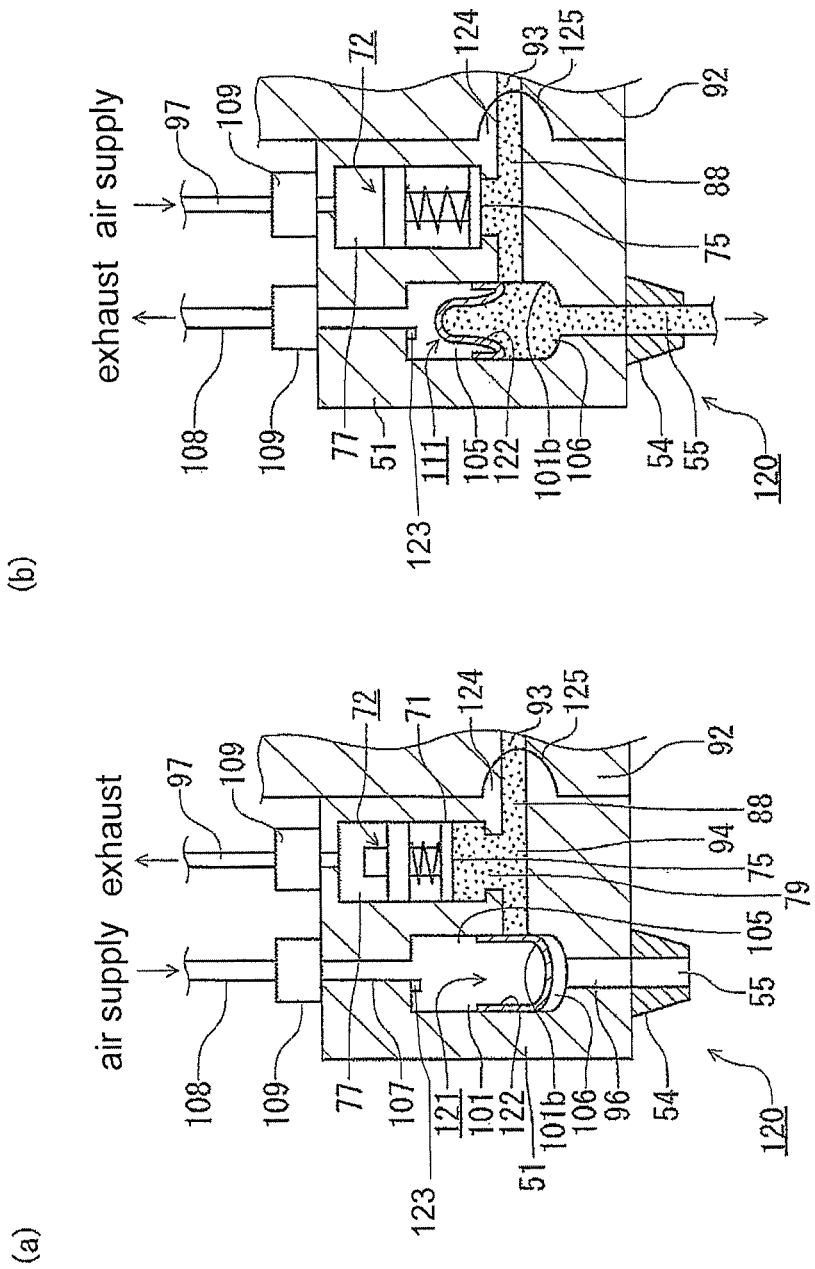
FIG. 21a and FIG. 21b each is a transverse side view of another cutoff valve.

The construction of the cutoff valve is not limited to the embodiments described above. Each of FIGS. 21a, 21b illustrates resist supply nozzle 120 equipped with cutoff valve 121. Resist supply nozzle 120 will be described with respect to the differences over resist supply nozzle 91. Cutoff valve 121 includes bellofram 122 instead of diaphragm 103 and cutoff valve main body 104. Bellofram 122 is a vessel having an opening at the upper side, which is constituted by a flexible thin film. The upper edge portion of bellofram 122 is fixed to the side wall of space 101.

As illustrated in FIG. 21a, when air is supplied to air flow-through space 105 and air flow-through space 105 is in a static pressure, bellofram 122 is pressed to a wall side 101b of space 101 to close the downstream end of chemical liquid flow path 94, and blocks the flow-through of resist 88 from chemical liquid flow path 94 to chemical liquid flow-through space 106. When air flow-through space 105 is exhausted to become a negative pressure, bellofram 122 is deformed such that the bottom side is risen to the upside. As a result, bellofram 122 is spaced from wall side 101b of space 101 and chemical liquid flow path 94 and chemical liquid flow-through space 106 is communicated to each other.

A displacement sensor 123, instead of liquid surface contact sensor 111, is provided in air flow-through space 105 of resist supply nozzle 120. Displacement sensor 123 detects the height of the bottom portion of bellofram 122 when air flow-through space 105 is exhausted, and outputs the detecting signal to control unit 90 based on the height. When bellofram 122 is broken, the ascending operation of bellofram 122 is suppressed, and displacement sensor 123 detects the suppressed ascending operation so that control unit 80 generates an alarm. However, the broken status of bellofram 122 may be detected by providing liquid surface contact sensor 111 to air flow-through space 105, irrelevant to displacement sensor 123. Displacement sensor 123 and liquid surface contact sensor 111 may be provided in each air flow-through space constituted by the suck back valve and the cutoff valve in each embodiment to detect the broken status of the suck back valve and the cutoff valve.

Also, a convex part 124 is formed in resist supply nozzle 120, and a concave part 125 is formed in chemical liquid flow path forming unit 92. Convex part 124 and concave part 125 are fitted to each other, and chemical liquid flow paths 94, 93 are formed in each of convex part 124 and concave part 125, respectively. With this structure, the sealing of chemical liquid flow paths 93, 94 is improved and the drying process of the resist is prevented. The constitution that forms convex part 124 and concave part 125 may be applied to other embodiments.

Figure 22:
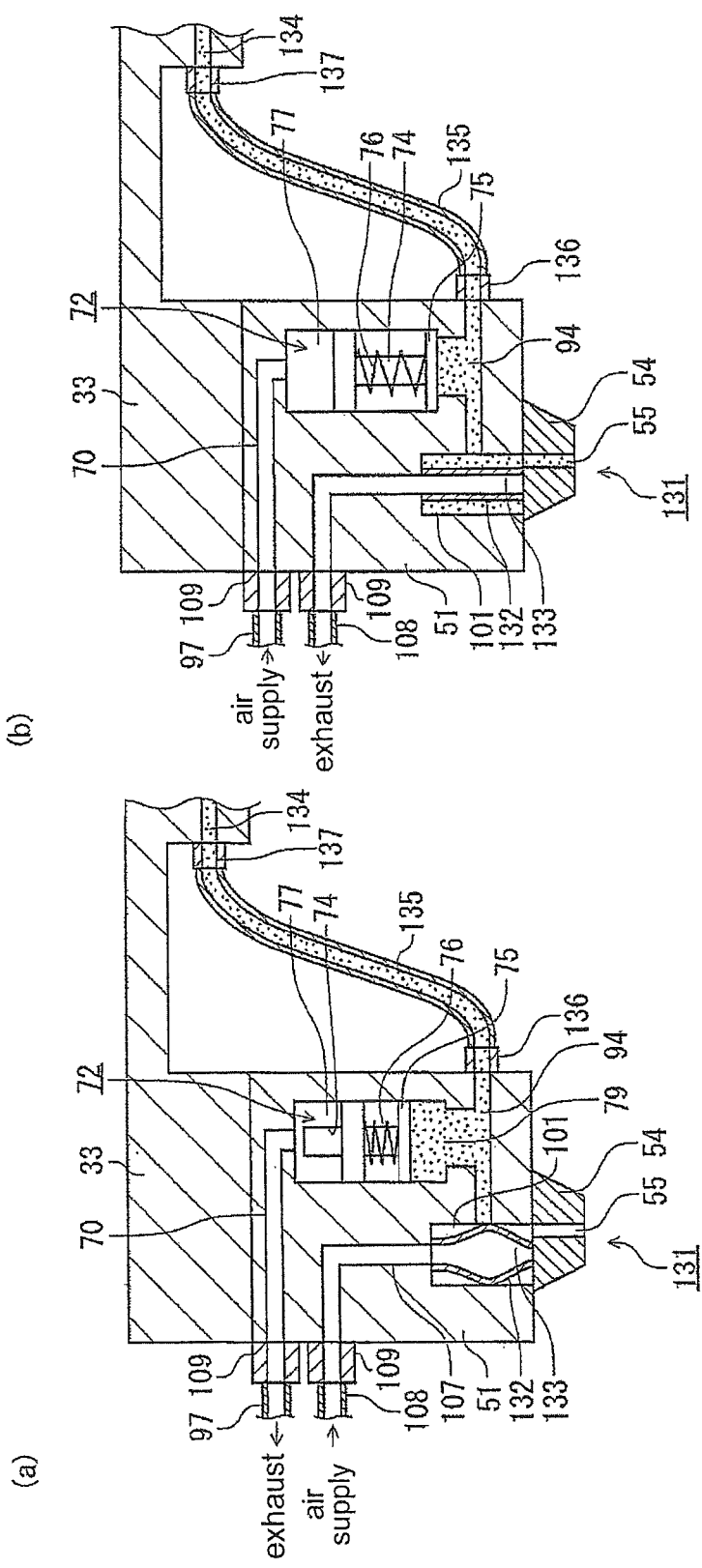
FIG. 22a and FIG. 22b each is a transverse side view of yet another cutoff valve.
Figure 23:
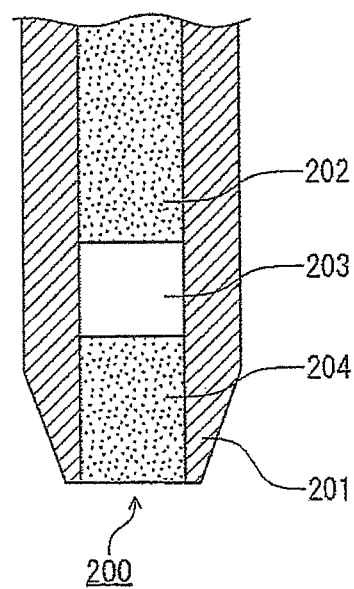
FIG. 23 is a transverse side view of the resist supply nozzle when the nozzle sucks up thinner.

Also, FIGS. 22a and 22b illustrate resist supply nozzle 131 equipped with tubefram 132 constituted by a flexible membrane as a cutoff valve. Referring to FIG. 22a, when air is supplied to space 133 inside tubefram 132, tubefram 132 is expanded to block the downstream end of chemical liquid flow path 94 and cutoff chemical liquid flow path 94 and discharge opening 55. Referring to FIG. 22b, air is removed from tubefram 132 so that tubefram 132 is contracted thereby communicating chemical liquid flow path 94 and discharge opening 55.

Also, resist supply nozzle 131 is provided below the front end of arm 33, and arm 33 is formed with a chemical liquid flow path 134 through which the resist flows. Chemical liquid flow path 134 and chemical liquid flow path 94 of resist supply nozzle 131 are connected to each other through tube 135. Each of both ends of tube 135 is detachably connected to resist supply nozzle 131 and arm 33, respectively, through a joint 136, 137.

Chemical liquids supplied from the nozzle of the present disclosure are not limited to the resist and thinner, but may be other chemical liquids such as a development liquid and a chemical liquid to form an anti-reflection coating.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A chemical liquid supply nozzle comprising:
a plurality of chemical liquid supply nozzles as a bundle, each of the plurality of chemical liquid supply nozzles includes:
   a block shaped nozzle main body connected to a front end of a flow path member through which chemical liquid flows;
   a chemical liquid flow path provided at the nozzle main body to pass the chemical liquid supplied from the flow path member therethrough;
   a cutoff valve provided at the chemical liquid flow path to open and close the chemical liquid flow path;
   a suction flow path provided at the nozzle main body to be connected to the chemical liquid flow path at an upstream side of the cutoff valve;
   a suction unit provided at the nozzle main body and configured to suck the chemical liquid remaining at a downstream side of the cutoff valve to an upstream side of the cutoff valve and remove by sucking the chemical liquid of the chemical liquid flow path to the suction flow path, after the chemical liquid is discharged from a downstream end of the chemical liquid flow path;
   a first fluid flow-through space formed at a downstream side of the suction flow path in the chemical liquid flow path, the first fluid flow-through space being connected to the chemical liquid flow path;
   a first valve main body that divides the first fluid flow-through space and the chemical liquid flow path and is capable of entering into the chemical liquid flow path and retreating from the chemical liquid flow path, the first valve main body being provided at the cutoff valve; and
   a first fluid flow path provided at the nozzle main body to perform an operation to increase pressure of the first fluid flow-through space and to shut off the chemical liquid flow path by pressing the first valve main body toward a wall surface directed to the first fluid flow-through space and an operation to decrease pressure of the first fluid flow-through space and to open the chemical liquid flow path by spacing the first valve main body from the wall surface, thereby supplying liquid to the first fluid flow-through space and removing the liquid from the first fluid flow-through space;
a block shaped flow path forming member provided to be close to each nozzle main body;
a first main flow path provided at the flow path forming member to supply the liquid to the first fluid flow path of each nozzle main body and to remove the liquid from the first fluid flow path, the first main flow path being common to each nozzle main body;
a first branch flow path provided at the flow path forming member, the first branch flow path being branched from the first main flow path to be connected to the first fluid flow path of each nozzle main body; and
a control valve provided at the flow path forming member to switch the opening and closing of each of the first branch flow path independently from each other.

2. The chemical liquid supply nozzle of claim 1, wherein the first main flow path is constituted by a first fluid supply main flow path and a first fluid removing main flow path, which are formed separately to each other;
each of the first branch flow paths is constituted by a first fluid supply branch flow path and a first fluid removing branch flow path, which are formed separately to each other;
each of the first fluid supply branch flow paths is connected to the first fluid flow path of each nozzle main body and the first fluid supply main flow path; and
each of the first fluid removing branch flow paths is connected to the first fluid flow path of each nozzle main body and the first fluid removing main flow path.

3. The chemical liquid supply nozzle of claim 1, further comprising a pressure means that presses the first valve main body toward the wall surface.

4. The chemical liquid supply nozzle of claim 1, the first valve main body includes a flexible membrane.

5. The chemical liquid supply nozzle of claim 4, wherein the first fluid flow path is a flow path common to a flow path to supply liquid to the first fluid flow-through space and a flow path to remove the liquid from the first fluid flow-through space.

6. The chemical liquid supply nozzle of claim 1, wherein the first fluid flow path is a flow path common to a flow path to supply liquid to the first fluid flow-through space and a flow path to remove the liquid from the first fluid flow-through space.

7. A chemical liquid supply nozzle comprising:
a plurality of chemical liquid supply nozzles as a bundle, each chemical liquid supply nozzle comprising:
   a block shaped nozzle main body connected to a front end of a flow path member through which chemical liquid flows;
   a chemical liquid flow path provided at the nozzle main body to pass the chemical liquid supplied from the flow path member therethrough;
   a cutoff valve provided at the chemical liquid flow path to open and close the chemical liquid flow path;
   a suction flow path provided at the nozzle main body to be connected to the chemical liquid flow path at an upstream side of the cutoff valve;
   a suction unit provided at the nozzle main body and configured to suck the chemical liquid remaining at a downstream side of the cutoff valve to an upstream side of the cutoff valve and remove by sucking the chemical liquid of the chemical liquid flow path to the suction flow path, after the chemical liquid is discharged from a downstream end of the chemical liquid flow path;
   a second valve main body provided at the suction unit to divide the suction flow path into a chemical liquid reservoir directed to the chemical liquid flow path and a second fluid flow-through space spaced from the chemical liquid flow path, the second valve main body being capable of advancing and retreating the suction flow path with respect to the chemical liquid flow path; and
   a second fluid flow path provided at the nozzle main body to perform an operation to increase pressure of the second fluid flow-through space and to direct the second valve main body toward the chemical liquid flow path and an operation to decrease pressure of the second fluid flow-through space and to suck the chemical liquid of the chemical liquid flow path to the suction flow path by moving the second valve main body to space the second valve main body from the chemical liquid flow path, thereby supplying liquid to the second fluid flow-through space and removing the liquid from the second fluid flow-through space;
a block shaped flow path forming member provided to be close to each nozzle main body;
a second main flow path provided at the flow path forming member to supply the liquid to the second fluid flow path of each nozzle main body and to remove the liquid from the second fluid flow path, the second main flow path being common to each nozzle main body;

a second branch flow path provided at the flow path forming member, the second branch flow path being branched from the second main flow path to be connected to the second fluid flow path of each nozzle main body; and a control valve provided at the flow path forming member to switch the opening and closing of each of the second branch flow path independently from each other.

8. The chemical liquid supply nozzle of claim 7, wherein the second main flow path is constituted by a second fluid supply main flow path and a second fluid removing main flow path, which are formed separately to each other;

each of the second branch flow paths is constituted by a second fluid supply branch flow path and a second fluid removing branch flow path, which are formed separately to each other;

each of the second fluid supply branch flow paths is connected to the second fluid flow path of each nozzle main body and the second fluid supply main flow path; and each of the second fluid removing branch flow paths is connected to the second fluid flow path of each nozzle main body and the second fluid removing main flow path.

9. The chemical liquid supply nozzle of claim 7, further comprising a pressure means that presses the second valve main body toward the chemical liquid flow path.

10. The chemical liquid supply nozzle of claim 9, wherein the pressure means is constituted by a spring.

11. The chemical liquid supply nozzle of claim 7, wherein the second fluid flow path is a flow path common to a flow path to supply liquid to the second fluid flow-through space and a flow path to remove the liquid from the second fluid flow-through space.

12. The chemical liquid supply nozzle of claim 11, wherein the plurality of chemical liquid supply nozzles as a bundle are detachably mounted to a support that supports the chemical liquid supply nozzles.

13. The chemical liquid supply nozzle of claim 7, wherein the plurality of chemical liquid supply nozzles as a bundle are detachably mounted to a support that supports the chemical liquid supply nozzles.

14. A method for supplying chemical liquid using a chemical liquid supply nozzle, the chemical liquid supply nozzle comprising:

using a plurality of chemical liquid supply nozzles as a bundle, each chemical liquid supply nozzle comprising:

a block shaped nozzle main body connected to a front end of a flow path member through which chemical liquid flows;

a chemical liquid flow path provided at the nozzle main body to pass the chemical liquid supplied from the flow path member therethrough;

a cutoff valve provided at the chemical liquid flow path to open and close the chemical liquid flow path;

a suction flow path provided at the nozzle main body to be connected to the chemical liquid flow path at an upstream side of the cutoff valve;

a suction unit provided at the nozzle main body and configured to suck the chemical liquid remaining at a downstream side of the cutoff valve to an upstream side of the cutoff valve and remove by sucking the chemical liquid of the chemical liquid flow path to the suction flow path, after the chemical liquid is discharged from a downstream end of the chemical liquid flow path;

a first fluid flow-through space formed at a downstream side of the suction flow path in the chemical liquid flow path, the first fluid flow-through space being connected to the chemical liquid flow path;

a first valve main body that divides the first fluid flow-through space and the chemical liquid flow path and is capable of entering into the chemical liquid flow path and retreating from the chemical liquid flow path, the first valve main body being provided at the cutoff valve; and a first fluid flow path provided at the nozzle main body to perform an operation to increase pressure of the first fluid flow-through space and to shut off the chemical liquid flow path by pressing the first valve main body toward a wall surface directed to the first fluid flow-through space and an operation to decrease pressure of the first fluid flow-through space and to open the chemical liquid flow path by spacing the first valve main body from the wall surface, thereby supplying liquid to the first fluid flow-through space and removing the liquid from the first fluid flow-through space, the method comprising:

supplying fluid to the main flow path provided at a block shaped flow path forming member formed to be close to each nozzle main body, the main flow path being common to each nozzle body;

supplying the fluid to the first fluid flow-through space through a first branch flow path provided at the flow path forming member such that the first branch flow path is branched from the main flow path to be connected to the first fluid flow path of each nozzle body, the fluid being supplied to the main flow path;

removing the fluid within the first fluid flow-through space of each nozzle body to the main flow path via the first branch flow path; and switching the opening/closing of each first branch flow path independently each other by control valves provided at the flow path forming member.

15. A method for supplying chemical liquid using a chemical liquid supply nozzle, the chemical liquid supply nozzle comprising:

using a plurality of chemical liquid supply nozzles as a bundle, each chemical liquid supply nozzle comprising:

a block shaped nozzle main body connected to a front end of a flow path member through which chemical liquid flows;

a chemical liquid flow path provided at the nozzle main body to pass the chemical liquid supplied from the flow path member therethrough;

a cutoff valve provided at the chemical liquid flow path to open and close the chemical liquid flow path;

a suction flow path provided at the nozzle main body to be connected to the chemical liquid flow path at an upstream side of the cutoff valve;

a suction unit provided at the nozzle main body and configured to suck the chemical liquid remaining at a downstream side of the cutoff valve to an upstream side of the cutoff valve and remove by sucking the chemical liquid of the chemical liquid flow path to the suction flow path, after the chemical liquid is discharged from a downstream end of the chemical liquid flow path;

a second valve main body provided at the suction unit to divide the suction flow path into a chemical liquid reservoir directed to the chemical liquid flow path and a second fluid flow-through space spaced from the chemical liquid flow path, the second valve main body being capable of advancing and retreating the suction flow path with respect to the chemical liquid flow path; and a second fluid flow path provided at the nozzle main body to perform an operation to increase pressure of the second fluid flow-through space and to direct the second valve main body toward the chemical liquid flow path and an operation to decrease pressure of the second fluid flow-through space and to suck the chemical liquid of the chemical liquid flow path to the suction flow path by moving the second valve main body to space the second valve main body from the chemical liquid flow path, thereby supplying liquid to the second fluid flow-through space and removing the liquid from the second fluid flow-through space, the method comprising:

supplying fluid to the main flow path provided at a block shaped flow path forming member formed to be close to each nozzle main body, the main flow path being common to each nozzle body;

supplying the fluid to the second fluid flow-through space through a second branch flow path provided at the flow path forming member such that the second branch flow path is branched from the main flow path to be connected to the second fluid flow path of each nozzle body, the fluid being supplied to the main flow path; removing the fluid within the second fluid flow-through space of each nozzle body to the main flow path via the second branch flow path; and switching the opening/closing of each second branch flow path independently each other by control valves provided at the flow path forming member.

* * * * *